(12) United States Patent
Nishihara et al.

(10) Patent No.: US 12,420,666 B2
(45) Date of Patent: Sep. 23, 2025

(54) INFORMATION PROCESSING METHOD, CONTROL DEVICE, AND INFORMATION PROCESSING SYSTEM CALCULATING REMAINING LIFE OF BATTERY

(71) Applicant: PANASONIC INTELLECTUAL PROPERTY MANAGEMENT CO., LTD., Osaka (JP)

(72) Inventors: Keiji Nishihara, Kanagawa (JP); Takahiro Kudoh, Kyoto (JP); Makoto Hashimoto, Kyoto (JP); Hiroshi Takao, Osaka (JP); Masaaki Takegata, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 229 days.

(21) Appl. No.: 18/089,040

(22) Filed: Dec. 27, 2022

(65) Prior Publication Data

US 2023/0132445 A1 May 4, 2023

Related U.S. Application Data

(63) Continuation of application No. PCT/JP2021/018902, filed on May 19, 2021.

(30) Foreign Application Priority Data

Jul. 8, 2020 (JP) .................................. 2020-117638

(51) Int. Cl.
 *B60L 58/16* (2019.01)
 *B60L 58/25* (2019.01)
(52) U.S. Cl.
 CPC ............... *B60L 58/16* (2019.02); *B60L 58/25* (2019.02); *B60L 2260/52* (2013.01)

(58) Field of Classification Search
 CPC ................................. B60L 58/25; B60L 58/16
 See application file for complete search history.

(56) References Cited

U.S. PATENT DOCUMENTS

| 2014/0019001 A1* | 1/2014 | Nishizawa | B60L 58/16 701/31.9 |
| 2014/0195181 A1* | 7/2014 | Nishizawa | H01M 10/54 702/63 |

(Continued)

FOREIGN PATENT DOCUMENTS

JP          6066330          1/2017

OTHER PUBLICATIONS

International Search Report (ISR) from International Searching Authority (Japan Patent Office) in International Pat. Appl. No. PCT/JP2021/018902, dated Aug. 10, 2021, together with an English language translation.

*Primary Examiner* — Jess Whittington
(74) *Attorney, Agent, or Firm* — GREENBLUM & BERNSTEIN, P.L.C.

(57) ABSTRACT

The server acquires first data concerning a load applied to a body of an electric mobile apparatus, acquires second data concerning the performance of a storage battery mounted on the mobile apparatus, calculates a remaining lifetime of the body on the basis of the first data, calculates a remaining lifetime of the battery on the basis of the second data, compares the remaining lifetime of the body with the remaining lifetime of the storage battery, and instructs at least one of an activation of an unused function and an enhancement of a used function among a plurality of functions consuming the electric power of the mobile apparatus when the remaining lifetime of the body is shorter than the remaining lifetime of the storage battery.

13 Claims, 15 Drawing Sheets

(56) References Cited

U.S. PATENT DOCUMENTS

| | | | |
|---|---|---|---|
| 2014/0256304 A1* | 9/2014 | Frye | H04W 4/21 |
| | | | 455/418 |
| 2016/0285136 A1* | 9/2016 | Abe | H01M 10/625 |
| 2018/0268621 A1* | 9/2018 | Oz | G07C 5/02 |
| 2018/0358663 A1* | 12/2018 | Yonemoto | B60L 58/16 |
| 2019/0207180 A1* | 7/2019 | Richter | G01C 21/3407 |
| 2021/0125420 A1* | 4/2021 | Tabata | G07C 5/006 |
| 2021/0335061 A1* | 10/2021 | Claessens | G07C 5/0816 |
| 2021/0362564 A1* | 11/2021 | Polyzois | B60H 1/00971 |

\* cited by examiner

FIG.10

THIS PACE PRECLUDES FULL
COMSUPTION OF BATTERY.
SELECT AMONG FUNCTIONS BELOW.

SELECTABLE         POWER
FUNCTIONS          CONSUMPTION

☐ INCREASE LUMINANCE   ○ ○
   OF HEADLAMP
☐ COMMUNICATION        ○ ○
   FUNCTION
☐ ENHANCE              ○ ○
   ACCELERATION

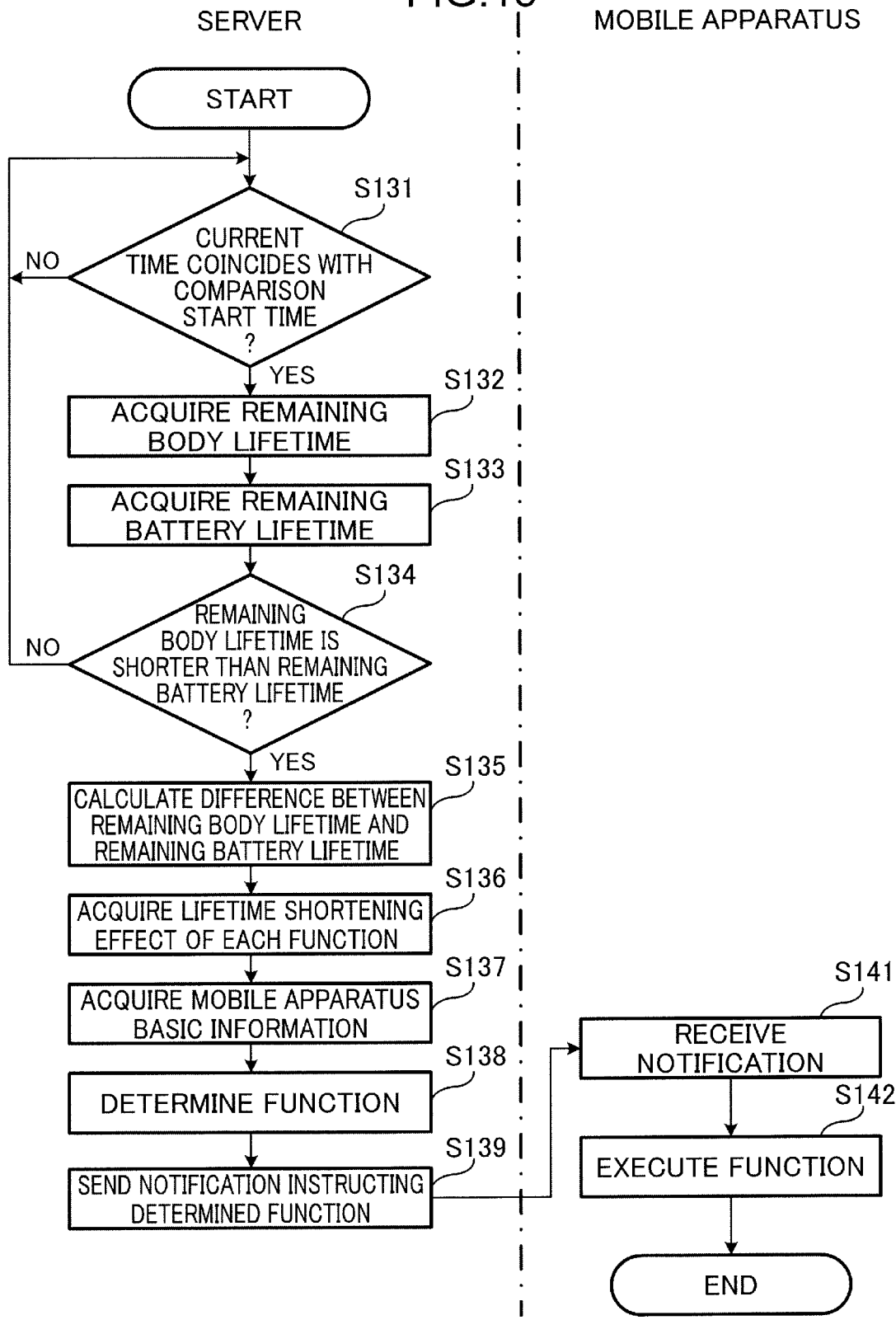

INFORMATION PROCESSING METHOD, CONTROL DEVICE, AND INFORMATION PROCESSING SYSTEM CALCULATING REMAINING LIFE OF BATTERY

TECHNICAL FIELD

The present disclosure relates to a technology for managing a remaining lifetime of a body of an electric mobile apparatus, and a remaining lifetime of a battery mounted on the mobile apparatus.

BACKGROUND ART

In recent years, vehicles mounted with a secondary battery have been widespread. Further, a system that estimates a lifetime of a vehicle and a lifetime of a secondary battery mounted on the vehicle has been developed.

For example, a recycled secondary battery supply estimating system disclosed in Patent Literature 1 includes a communication part that receives performance information on a secondary battery mounted on a vehicle and state information on the vehicle, and a battery performance estimating part that estimates a lifetime of the vehicle using a history of the state information on the vehicle, and estimates the performance of the secondary battery at an end of the lifetime of the vehicle using a history of the performance information on the secondary battery.

However, the conventional technology is liable to involve a problem due to a difference between a remaining lifetime of a battery of a mobile apparatus and a remaining lifetime of a body of the mobile apparatus.

CITATION LIST

Patent Literature

Patent Literature 1: Japanese Patent Publication No. 6066330

SUMMARY OF INVENTION

The present disclosure has been made in order to solve the problem described above, and an object thereof is to provide a technology that enables the remaining lifetime of a battery of a mobile apparatus to approach the remaining lifetime of a body of the mobile apparatus.

An information processing method according to an aspect of the present disclosure, which is executed by a computer, comprises acquiring first data concerning a load applied to a body of an electric mobile apparatus, acquiring second data concerning the performance of a battery mounted on the mobile apparatus, calculating a remaining lifetime of the body on the basis of the first data, calculating a remaining lifetime of the battery on the basis of the second data, comparing the remaining lifetime of the body with the remaining lifetime of the battery, and instructing, when the remaining lifetime of the body is shorter than the remaining lifetime of the battery, at least one of an activation of an unused function and an enhancement of a used function among a plurality of functions consuming the electric power of the mobile apparatus.

The present disclosure enables the remaining lifetime of a battery of a mobile apparatus to approach the remaining lifetime of a body of the mobile apparatus.

BRIEF DESCRIPTION OF DRAWINGS

FIG. 10 is an illustration showing exemplary function presenting information in Embodiment 1 of the present disclosure.

FIG. 15 is a flowchart showing a process of comparing a remaining body lifetime with a remaining battery lifetime in Embodiment 2 of the present disclosure.

DESCRIPTION OF EMBODIMENTS

Knowledge Underlying the Present Disclosure

Figure 1:
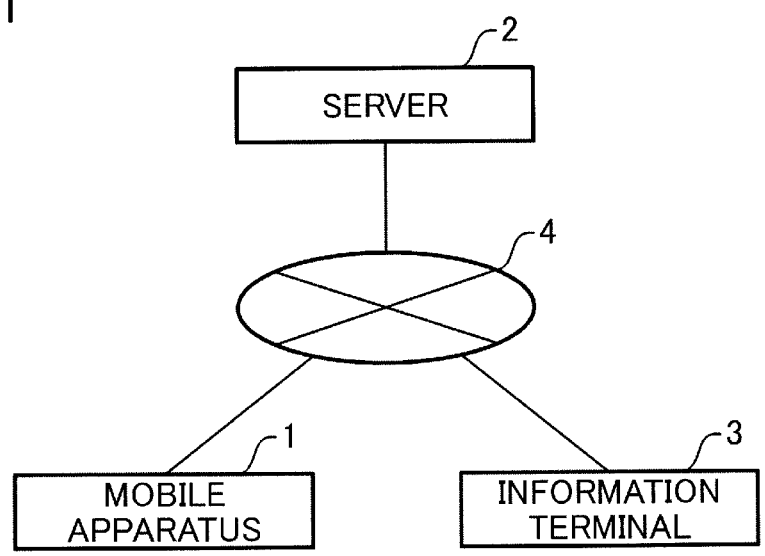
FIG. 1 is a diagram showing a general configuration of an information processing system according to Embodiment 1 of the present disclosure.

When a lifetime of a vehicle is shorter than a lifetime of a secondary battery mounted on the vehicle, there is a likelihood that the secondary battery is disposed of together with the vehicle even though the secondary battery is still sufficiently usable. In view thereof, the wasteful disposal of a secondary battery can be prevented by controlling the vehicle such that the remaining lifetime of the secondary battery approaches the remaining lifetime of the vehicle.

However, the conventional technology aims at estimating when, what quantity, and what quality of reusable secondary batteries will be supplied. Therefore, the conventional technology fails to take into account controlling the vehicle such that the remaining lifetime of the secondary battery approaches the remaining lifetime of vehicle when the remaining lifetime of the vehicle is estimated to be shorter than the remaining lifetime of the secondary battery.

In order to solve the problem described above, an information processing method according to an aspect of the present disclosure, which is executed by a computer, includes acquiring first data concerning a load applied to a body of an electric mobile apparatus, acquiring second data concerning the performance of a battery mounted on the mobile apparatus, calculating a remaining lifetime of the body on the basis of the first data, calculating a remaining lifetime of the battery on the basis of the second data, comparing the remaining lifetime of the body with the remaining lifetime of the battery, and instructing at least one of an activation of an unused function and an enhancement of a used function among a plurality of functions consuming the electric power of the mobile apparatus when the remaining lifetime of the body is shorter than the remaining lifetime of the battery.

In this configuration, when the remaining lifetime of the body is shorter than the remaining lifetime of the battery, at least one of an activation of an unused function and an enhancement of a used function among a plurality of functions consuming the electric power of the mobile apparatus is instructed. Therefore, the remaining lifetime of the battery of the mobile apparatus can be made to approach the remaining lifetime of the body of the mobile apparatus. This can consequently prevent a disposal of the battery still having a lifetime together with the body having no lifetime. Further, the activation of an unused function or the enhancement of a used function can increase the convenience for a driver. In other words, the remaining lifetime of the battery of the mobile apparatus can be made to approach the remaining lifetime of the body of the mobile apparatus by efficiently consuming the lifetime of the battery of the mobile apparatus.

Further, it may be appreciated in the information processing method that, in the instruction, at least one of the activation of an unused function and the enhancement of a used function is presented on a presentation device, at least one of the function to be activated and the function to be enhanced is determined on the basis of a response to the presentation, and the determined at least one of the activation of the function and the enhancement of the function is instructed.

In this configuration, at least one of the activation of an unused function and the enhancement of a used function is presented by the presentation device. This enables a manager of the mobile apparatus to select at least one of a desired function to be activated and a desired function to be enhanced.

It may be also appreciated in the information processing method that, in the presentation, at least one of a type of the mobile apparatus, a use mode of the mobile apparatus, and a use record of the mobile apparatus is acquired, at least one candidate of a function to be activated and a function to be enhanced is determined in accordance with the acquired at least one of the type, use mode, and use record of the mobile apparatus, and the determined candidate is presented on the presentation device.

In this configuration, a candidate of a function to be activated or a function to be enhanced may be changed depending on the type of the mobile apparatus. This enables a consumption of a lifetime of the battery suitable for the type of the mobile apparatus. Further, a candidate of a function to be activated or a function to be enhanced may be changed depending on the use mode of the mobile apparatus. This enables a consumption of a lifetime of the battery suitable for the use mode. Further, a candidate of a function to be activated or a function to be enhanced may be changed depending on the use record of the mobile apparatus. This enables a consumption of a lifetime of the battery suitable for the actual use.

It may be also appreciated in the information processing method that, in the presentation, a difference between the remaining lifetime of the battery and the remaining lifetime of the body is calculated, at least one candidate of a function to be activated and a function to be enhanced is determined in accordance with the calculated difference, and the determined candidate is presented on the presentation device.

In this configuration, at least one candidate of a function to be activated and a function to be enhanced can be determined in such a manner that at least one of a reduction of the remaining battery lifetime due to the activation of an unused function and a reduction of the remaining battery lifetime due to the enhancement of a used function is kept from exceeding a difference between the remaining battery lifetime and the remaining body lifetime. In other words, an excessive enhancement of the consumption of the battery lifetime can be prevented.

It may be also appreciated in the information processing method that, in the presentation, at least one of a type of the mobile apparatus, a use mode of the mobile apparatus, and a use record of the mobile apparatus is acquired, a priority degree of the presentation of at least one of a function to be activated and a function to be enhanced is determined in accordance with the acquired at least one of the type, use mode, and use record of the mobile apparatus, and at least one of the activation of an unused function and the enhancement of a used function is presented on the presentation device according to the determined priority degree.

In this configuration, a priority degree of the presentation of at least one of a function to be activated and a function to be enhanced is determined in accordance with at least one of the type, use mode, and use record of the mobile apparatus. Therefore, for example, the presentation of at least one of a function to be activated and a function to be enhanced in a descending order of priority degree enables the manager to easily select at least one of a function to be activated and a function to be enhanced.

It may be also appreciated in the information processing method that, in the instruction, a difference between the remaining lifetime of the battery and the remaining lifetime of the body is calculated, at least one of a function to be activated and a function to be enhanced is determined in accordance with the difference, and the determined at least one of the activation of the function and the enhancement of the function is instructed.

In this configuration, at least one of the function to be activated and the function to be enhanced is automatically instructed, thereby allowing the mobile apparatus to automatically execute the instructed at least one of the activation of the function and the enhancement of the function.

It may be also appreciated in the information processing method that the remaining lifetime of the body and the remaining lifetime of the battery are expressed in the form of a remaining travel distance which the mobile apparatus can travel up to.

In this configuration, the remaining lifetime of the body and the remaining lifetime of the battery are expressed in the form of a remaining travel distance which the mobile apparatus can travel up to, thereby enabling an easy comparison between the remaining lifetime of the body with the remaining lifetime of the battery.

It may be also appreciated in the information processing method that the functions include a function of controlling the travel of the mobile apparatus.

In this configuration, the function, not in use, of controlling the travel can be activated, and the function, in use, of controlling the travel can be enhanced in the mobile apparatus, thereby increasing the convenience for the driver.

It may be also appreciated in the information processing method that the functions include a function of assisting a visual perception of the mobile apparatus.

In this configuration, the function, not in use, of assisting the visual perception can be activated, and the function, in use, of assisting the visual perception can be enhanced in the mobile apparatus, thereby increasing the convenience for the driver.

It may be also appreciated in the information processing method that the functions include a function of controlling a space of the mobile apparatus.

In this configuration, the function, not in use, of controlling the space can be activated, and the function, in use, of controlling the space can be enhanced in the mobile apparatus, thereby increasing the convenience for the driver.

It may be also appreciated in the information processing method that the functions include a function of supplying an electric power to an outside of the mobile apparatus.

In this configuration, the function, not in use, of supplying an electric power to an outside can be activated in the mobile apparatus, thereby increasing the convenience for the driver.

It may be also appreciated in the information processing method that the functions include a function of performing communications of the mobile apparatus, or a function of performing an external connection by use of the communication function.

In this configuration, an unused communication function or the external connection function using the communication function can be activated in the mobile apparatus, thereby increasing the convenience for the driver.

It may be also appreciated in the information processing method that the first data includes at least one of a travelled distance of the mobile apparatus and a received impact of the mobile apparatus, and in the calculation of a remaining lifetime of the body, the remaining lifetime of the body is calculated on the basis of a statistical lifetime of the mobile apparatus, and the at least one of the travelled distance of the mobile apparatus and the received impact of the mobile apparatus.

In this configuration, at least one of a travelled distance of the mobile apparatus and a received impact of the mobile apparatus is acquired, thereby enabling a more accurate calculation of the remaining lifetime of the body.

It may be also appreciated in the information processing method that the second data includes a history of at least one of a charge, a discharge, a charge capacity, and a temperature of the battery, and in the calculation of a remaining lifetime of the battery, the remaining lifetime of the battery is calculated on the basis of a lifetime of the battery and a deterioration level of the battery calculated from the history of the battery.

In this configuration, at least one of a charge, a discharge, a charge capacity, and a temperature of a battery related to a deterioration of the battery due to the charge, a deterioration of the battery due to the discharge, a deterioration of the battery due to the storage is acquired, thereby enabling a more accurate calculation of the remaining lifetime of the battery.

A control device according to another aspect of the present disclosure, which is mounted on an electric mobile apparatus, includes a communication part that sends first data concerning a load applied to a body of the mobile apparatus, sends second data concerning the performance of a battery mounted on the mobile apparatus, and receives a notification instructing at least one of an activation of an unused function and an enhancement of a used function among a plurality of functions consuming the electric power of the mobile apparatus when a remaining lifetime of the body calculated on the basis of the first data is shorter than a remaining lifetime of the battery calculated on the basis of the second data, and a control part that executes at least one of the activation of the unused function and the enhancement of the used function in accordance with the received notification.

In this configuration, when the remaining lifetime of the body is shorter than the remaining lifetime of the battery, a notification instructing at least one of an activation of an unused function and an enhancement of a used function among a plurality of functions consuming the electric power of the mobile apparatus is received. Thereafter, at least one of the activation of the unused function and the enhancement of the used function is executed in accordance with the received notification. Therefore, the remaining lifetime of the battery of the mobile apparatus can be made to approach the remaining lifetime of the body of the mobile apparatus. This can consequently prevent a disposal of the battery still having a lifetime together with the body having no lifetime. Further, the activation of an unused function or the enhancement of a used function can increase the convenience for the driver. In other words, the remaining lifetime of the battery of the mobile apparatus can be made to approach the remaining lifetime of the body of the mobile apparatus by efficiently consuming the lifetime of the battery of the mobile apparatus.

An information processing system according to another aspect of the present disclosure includes a first data acquiring part that acquires first data concerning a load applied to a body of an electric mobile apparatus, a second data acquiring part that acquires second data concerning the performance of a battery mounted on the mobile apparatus, a remaining body lifetime calculating part that calculates a remaining lifetime of the body on the basis of the first data, a remaining battery lifetime calculating part that calculates a remaining lifetime of the battery on the basis of the second data, a comparing part that compares the remaining lifetime of the body with the remaining lifetime of the battery, and an instruction part that instructs at least one of an activation of an unused function and an enhancement of a used function among a plurality of functions consuming the electric power of the mobile apparatus when the remaining lifetime of the body is shorter than the remaining lifetime of the battery.

In this configuration, when the remaining lifetime of the body is shorter than the remaining lifetime of the battery, at least one of an activation of an unused function and an enhancement of a used function among a plurality of functions consuming the electric power of a mobile apparatus is instructed. Therefore, the remaining lifetime of the battery of the mobile apparatus can be made to approach the remaining lifetime of the body of the mobile apparatus. This can consequently prevent a disposal of the battery still having a lifetime together with the body having no lifetime. Further, the activation of an unused function and the enhancement of a used function can increase the convenience for the driver. In other words, the remaining lifetime of the battery of the mobile apparatus can be made to approach the remaining lifetime of the body of the mobile apparatus by efficiently consuming the lifetime of the battery of the mobile apparatus.

Hereinafter, an embodiment of the present disclosure will be described with reference to the accompanied drawings. It should be noted that the below-described embodiments are a specific example of the present disclosure, and will not delimit the technical scope of the present disclosure.

Embodiment 1

FIG. 1 is a diagram showing a general configuration of an information processing system according to Embodiment 1 of the present disclosure.

An information processing system shown in FIG. 1 includes a mobile apparatus 1, a server 2, and an information terminal 3.

The mobile apparatus 1 includes, for example, an electric kick scooter (an electric scooter), an electric bicycle, an unmanned flying object such as a drone, a robotic vacuum cleaner, or an electric car, and moves by supplying to an electric motor an electric power charged in a storage battery. The mobile apparatus 1 is used by an individual user, is shared by a plurality of users, or is shared by a plurality of employees of a company. Particularly, in an electric kick scooter, a lifetime of a body is liable to be shorter than a lifetime of a storage battery.

The mobile apparatus 1 is mutually communicably connected to the server 2 via a network 4. The network 4 includes, for example, Internet.

The server 2 includes, for example, a web server. The server 2 receives various information from the mobile apparatus 1 and the information terminal 3, and sends various information to the mobile apparatus 1 and the information terminal 3. The server 2 calculates a remaining lifetime of the body or a housing of the mobile apparatus 1, and calculates a remaining lifetime of the battery. Thereafter, the server 2 compares the remaining lifetime of the body or the housing with the remaining lifetime of the battery, and instructs, when the remaining lifetime of the body or the housing is shorter than the remaining lifetime of the battery, at least one of an activation of an unused function and an enhancement of a used function among a plurality of functions consuming the electric power of the mobile apparatus 1.

The information terminal 3 is, for example, a smartphone, a tablet-type computer, a personal computer, or a terminal mounted on the mobile apparatus 1, and is used by a manager of the mobile apparatus 1. When the mobile apparatus 1 is used by an individual user, the individual user is the manager of the mobile apparatus 1. When the mobile apparatus 1 is shared by the users, an employee of a company administrating a sharing service of the mobile apparatus 1 is the manager of the mobile apparatus 1. When the mobile apparatus 1 is shared by the employees of a company, a person of the company is the manager of the mobile apparatus 1. The information terminal 3 is mutually communicably connected to the server 2 via the network 4.

Figure 2:
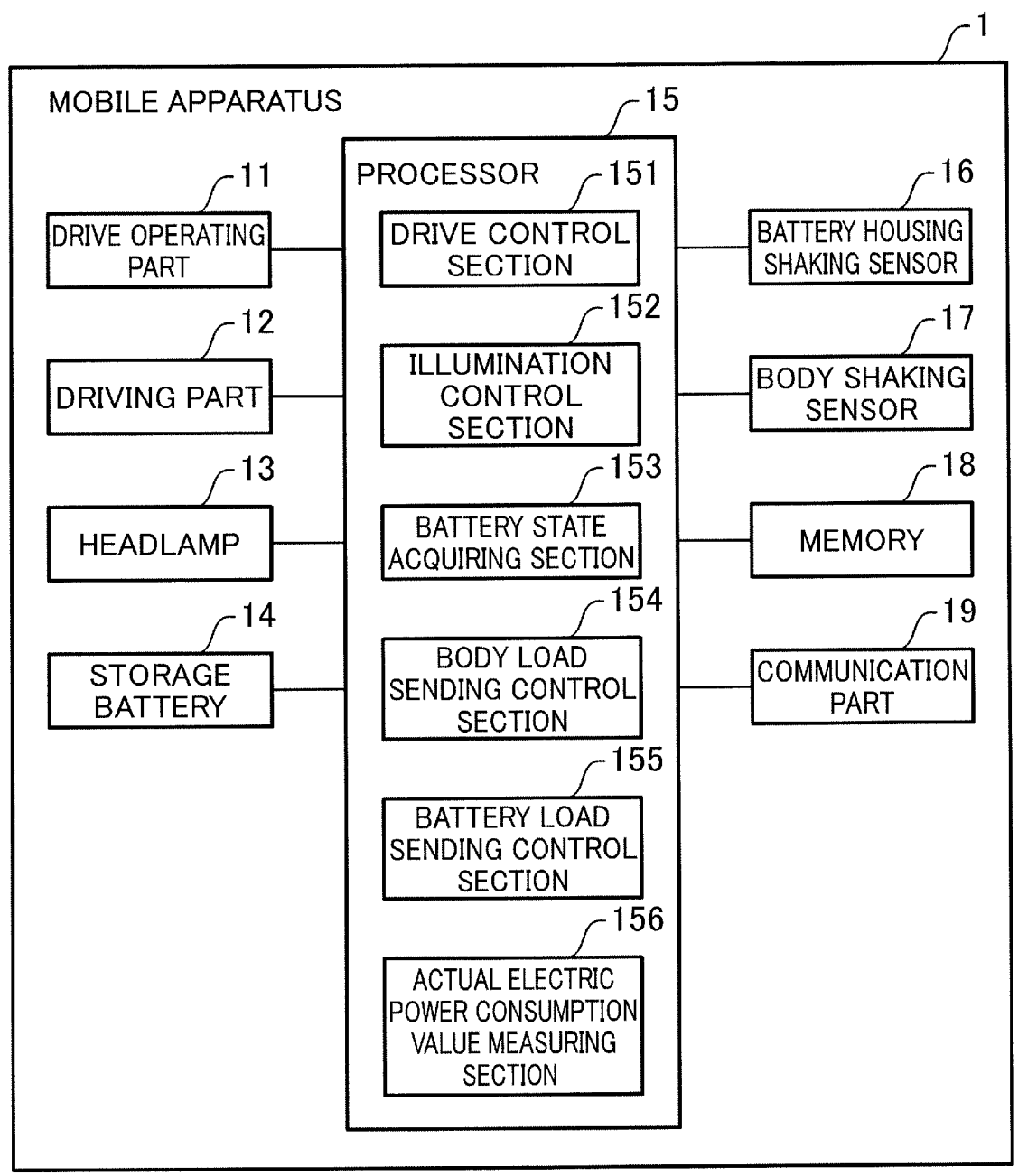
FIG. 2 is a diagram showing an exemplary configuration of a mobile apparatus according to Embodiment 1 of the present disclosure.

FIG. 2 is a diagram showing an exemplary configuration of a mobile apparatus according to Embodiment 1 of the present disclosure.

The mobile apparatus 1 includes a drive operating part 11, a driving part 12, a headlamp 13, a storage battery 14, a processor 15, a battery housing shaking sensor 16, a body shaking sensor 17, a memory 18, and a communication part 19.

The drive operating part 11 receives a drive operation of the mobile apparatus 1 by the driver. The drive operating part 11 includes, for example, an accelerator grip. When the accelerator grip is rotated by the driver, the drive operating part 11 detects an accelerator opening degree of the accelerator grip, and outputs to the processor 15 an acceleration request including the detected accelerator opening degree.

The driving part 12 includes, for example, an inverter, an electric motor, and a transmission, and moves the mobile apparatus 1 in accordance with a control by a drive control section 151.

The headlamp 13 is attached to a front face of the mobile apparatus 1, and illuminates in front of the mobile apparatus 1.

The storage battery 14 includes, for example, a lithium-ion secondary battery, stores an electric power by charging, and supplies the electric power to the driving part 12 under a discharge. The storage battery 14 is an exemplary battery.

The battery housing shaking sensor 16 is provided in the housing of the storage battery 14. The battery housing shaking sensor 16 measures a mechanical load to the storage battery 14. The battery housing shaking sensor 16 measures, for example, the number of shakings of the housing of the storage battery 14. The battery housing shaking sensor 16 stores in the memory 18 the measured number of shakings of the housing of the storage battery 14.

The body shaking sensor 17 is provided on the body of the mobile apparatus 1. The body shaking sensor 17 measures a mechanical load to the body of the mobile apparatus 1. The body shaking sensor 17 measures, for example, the number of shakings of the body of the mobile apparatus 1. The body shaking sensor 17 stores in the memory 18 the measured number of shakings of the body of the mobile apparatus 1.

The processor 15 is, for example, a Central Processing Unit (CPU), and controls the entire mobile apparatus 1. The processor 15 furnishes the drive control section 151, an illumination control section 152, a battery state acquiring section 153, a body load sending control section 154, a battery load sending control section 155, and an actual electric power consumption value measuring section 156.

The drive control section 151 controls the driving part 12 in accordance with a drive operation of the driver via the drive operating part 11 to thereby move the mobile apparatus 1. The drive control section 151 calculates on the basis of an acceleration request from the drive operating part 11 a target speed and an acceleration time until reaching the target speed, and accelerates the mobile apparatus 1 in accordance with the calculated target speed and acceleration time.

The illumination control section 152 controls a luminance of the headlamp 13. Usually, the illumination control section 152 sets the luminance of the headlamp 13 to a reference luminance determined in advance.

The battery state acquiring section 153 acquires from the memory 18 the number of charge and discharge cycles of the storage battery 14. For example, when charged from the capacity of 0% to 100%, one cycle of charge and discharge is counted. For example, when charged from the capacity of 20% to 60%, a 0.4 cycle of charge and discharge is counted.

In this Embodiment 1, the battery state acquiring section 153 acquires the number of charge and discharge cycles for calculating a remaining lifetime of the storage battery 14 in the server 2, but the present disclosure is not particularly limited thereto. The battery state acquiring section 153 may acquire various information concerning the performance of the storage battery 14 required for calculating the remaining lifetime of the storage battery 14. For example, the battery state acquiring section 153 may acquire SOC (State of Charge), SOH (State of Health), a temperature, or a total electric discharge of the storage battery 14.

The body load sending control section 154 sends to the server 2 via the communication part 19 body load data (first data) concerning a load applied to the body of the electric mobile apparatus 1. The body load data includes, for example, the number of shakings of the body of the mobile apparatus 1 measured by the body shaking sensor 17. The body load sending control section 154 acquires from the memory 18 the number of shakings of the body of the mobile apparatus 1.

The battery load sending control section 155 sends to the server 2 via the communication part 19 battery load data (second data) concerning the performance of the storage battery (battery) 14 mounted on the mobile apparatus 1. The battery load data includes the number of shakings of the housing of the storage battery 14 measured by the battery housing shaking sensor 16 and the number of charge and discharge cycles of the storage battery 14 acquired by the battery state acquiring section 153. The battery load sending control section 155 acquires from the memory 18 the number of shakings of the housing of the storage battery 14.

The memory 18 is, for example, a storage device capable of storing a variety of information, e.g., Random Access Memory (RAM), Solid State Drive (SSD), or Flash Memory.

The communication part 19 sends to the server 2 the body load data (first data) concerning the load applied to the body of the mobile apparatus 1. Further, the communication part 19 sends to the server 2 the battery load data (second data) concerning the performance of the storage battery (battery) 14 mounted on the mobile apparatus 1.

When the remaining lifetime of the body calculated on the basis of the body load data (first data) is shorter than the remaining lifetime of the storage battery (battery) 14 calculated on the basis of the battery load data (second data), the communication part 19 receives a notification instructing at least one of an activation of an unused function and an enhancement of a used function among a plurality of functions consuming the electric power of the mobile apparatus 1.

The drive control section 151 executes at least one of the activation of an unused function and the enhancement of a used function in accordance with the notification received by the communication part 19.

Here, the functions consuming the electric power of the mobile apparatus 1 will be described.

The functions include functions of controlling the travel in the mobile apparatus 1. The functions of controlling the travel include, for example, a function of controlling an acceleration, a function of controlling the quietness, and a function of controlling a drive assistance. When a notification instructing an enhancement of the used function of controlling the acceleration is received, the drive control section 151 enhances the used function of controlling the acceleration. For example, the drive control section 151 enhances the function of controlling the acceleration of the mobile apparatus 1 by at least one of increasing a target speed and shortening an acceleration time.

Further, when a notification instructing an activation of the unused function of controlling the quietness is received, the drive control section 151 activates the unused function of controlling the quietness. For example, the drive control section 151 activates the function of the mobile apparatus 1 of controlling the quietness by activating a function of an active suspension control.

Further, when a notification instructing an activation of the unused function of controlling the drive assistance is received, the drive control section 151 activates the unused function of controlling the drive assistance. For example, the drive control section 151 activates the function of controlling the drive assistance of the mobile apparatus 1 by activating a function of an autocruise control.

Further, the functions include a function of assisting a visual perception of the mobile apparatus 1. The function of assisting a visual perception includes, for example, a function of controlling a luminance, a defogging function, and a defrosting function. When a notification instructing an enhancement of the used function of controlling the luminance is received, the drive control section 151 enhances the used function of controlling the luminance. For example, the drive control section 151 enhances the function of controlling the luminance of the mobile apparatus 1 by making the luminance of the headlamp 13 be higher than the reference luminance.

Further, when a notification instructing an activation of the unused defogging function is received, the drive control section 151 activates the unused defogging function. For example, the drive control section 151 activates the defogging function of the mobile apparatus 1 by sending air dehumidified by an air conditioner on a foggy windshield.

Further, when a notification instructing an activation of the unused defrosting function is received, the drive control section 151 activates the unused defrosting function. For example, the drive control section 151 activates the defrosting function of the mobile apparatus 1 by sending air dehumidified by the air conditioner on a frosted windshield.

Further, the functions include a function of controlling a space of the mobile apparatus 1. The function of controlling the space includes, for example, a function of cooling air, a function of heating air, a function of humidifying air, a function of dehumidifying air, and a function of purifying air. Mainly, an electric car has the function of controlling the space. When a notification instructing an activation of any one of the unused functions of cooling air, heating air, humidifying air, dehumidifying air, and purifying air is received, the drive control section 151 activates any one of the unused functions of cooling air, heating air, humidifying air, dehumidifying air, and purifying air.

Alternatively, when a notification instructing an enhancement of any one of the used functions of cooling air, heating air, humidifying air, dehumidifying air, and purifying air is received, the drive control section 151 enhances any one of the used functions of cooling air, heating air, humidifying air, dehumidifying air, and purifying air.

Further, the functions include a function of supplying an electric power to an outside of the mobile apparatus 1. When a notification instructing an activation of the unused function of supplying an electric power to the outside is received, the drive control section 151 activates the unused function of supplying an electric power to the outside. For example, the drive control section 151 activates the function of supplying an electric power to the outside of the mobile apparatus 1 by supplying the electric power to a USB (Universal Serial Bus) port provided on the mobile apparatus 1.

Further, the functions include a function of performing communications, or a function of performing an external connection by use of the communication function of the mobile apparatus 1. When a notification instructing an activation of the unused function of performing communications is received, the drive control section 151 activates the unused function of performing communications. For example, the drive control section 151 activates the function of performing communications of the mobile apparatus 1 by permitting communications between the mobile apparatus 1 and an external device via a wireless communication.

Further, when a notification instructing an activation of the unused function of performing an external connection by use of the communication function is received, the drive control section 151 activates the unused function of performing an external connection by use of the communication function. For example, the drive control section 151 activates the function of performing an external connection by use of the communication function by permitting communications between the mobile apparatus 1 and the external device via a wireless communication, and operating the mobile apparatus 1 and the external device in connection with each other. For example, when the external device is an intercom, the intercom sends a captured image to the mobile apparatus 1, and the drive control section 151 displays the received image on an unillustrated display.

The actual electric power consumption value measuring section 156 measures an electric power consumption in the case of activating an unused function among functions consuming the electric power of the mobile apparatus 1. Further, the actual electric power consumption value measuring section 156 measures an electric power consumption in the case of enhancing a used function among the functions consuming the electric power of the mobile apparatus 1.

For example, the actual electric power consumption value measuring section 156 measures an electric power consumption in the case of actually accelerating the mobile apparatus 1 by enhancing the used function of controlling the acceleration of the mobile apparatus 1. The actual electric power consumption value measuring section 156 may measure an electric power consumption before the enhancement of the function of controlling the acceleration of the mobile apparatus 1, and measure an electric power consumption after the enhancement of the function of controlling the acceleration of the mobile apparatus 1. Thereafter, the actual electric power consumption value measuring section 156 may calculate a difference between the electric power consumption after the enhancement of the function of controlling the acceleration of the mobile apparatus 1 and the electric power consumption before the enhancement of the function of controlling the acceleration of the mobile apparatus 1.

Further, for example, the actual electric power consumption value measuring section 156 activates the unused function of controlling the quietness of the mobile apparatus 1, and measures an electric power consumption in the case of running the function of controlling the quietness. The actual electric power consumption value measuring section 156 may measure an electric power consumption before the activation of the function of controlling the quietness of the mobile apparatus 1, and measure an electric power consumption after the activation of the function of controlling the quietness of the mobile apparatus 1. Thereafter, the actual electric power consumption value measuring section 156 may calculate a difference between the electric power consumption after the activation of the function of controlling the quietness of the mobile apparatus 1 and the electric power consumption before the activation of the function of controlling the quietness of the mobile apparatus 1.

The communication part 19 sends to the server 2 an actual electric power consumption value of each function measured by the actual electric power consumption value measuring section 156.

Figure 3:
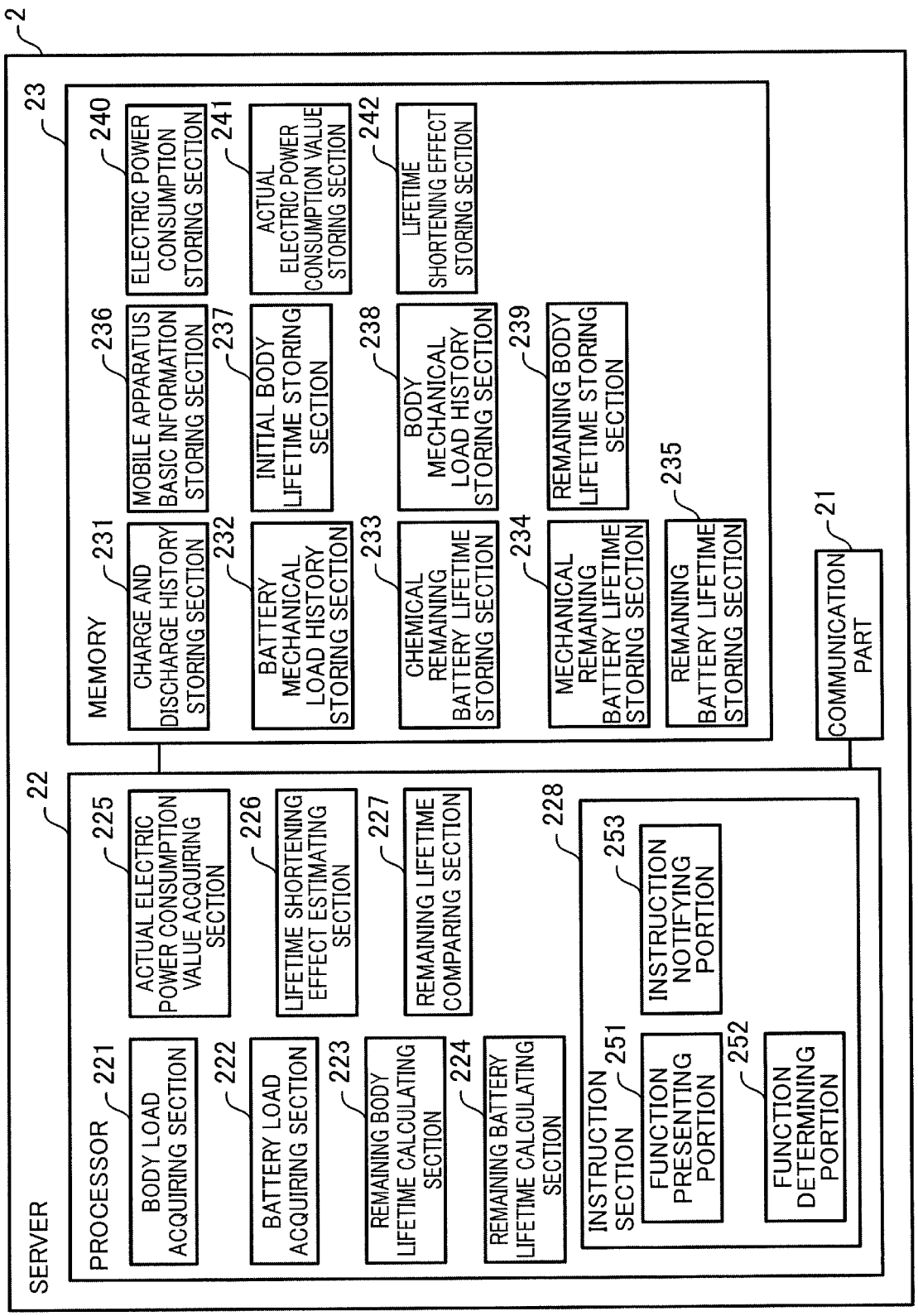
FIG. 3 is a diagram showing an exemplary configuration of a server according to Embodiment 1 of the present disclosure.

FIG. 3 is a diagram showing an exemplary configuration of a server according to Embodiment 1 of the present disclosure.

The server 2 shown in FIG. 3 includes a communication part 21, a processor 22, and a memory 23.

The communication part 21 receives body load data sent from the mobile apparatus 1. The communication part 21 receives battery load data sent from the mobile apparatus 1. The communication part 21 receives an actual electric power consumption value of each function sent from the mobile apparatus 1.

The memory 23 is, for example, a storage device capable of storing a variety of information, e.g., RAM, HDD (Hard Disk Drive), SSD, or Flash Memory. The memory 23 furnishes a charge and discharge history storing section 231, a battery mechanical load history storing section 232, a chemical remaining battery lifetime storing section 233, a mechanical remaining battery lifetime storing section 234, a remaining battery lifetime storing section 235, a mobile apparatus basic information storing section 236, an initial body lifetime storing section 237, a body mechanical load history storing section 238, a remaining body lifetime storing section 239, an electric power consumption storing section 240, an actual electric power consumption value storing section 241, and a lifetime shortening effect storing section 242.

The charge and discharge history storing section 231 stores a charge and discharge history of the storage battery 14 of the mobile apparatus 1. The charge and discharge history storing section 231 stores a history of the number of charge and discharge cycles of the storage battery 14 of the mobile apparatus 1.

Further, in the present Embodiment 1, the charge and discharge history storing section 231 stores the history of the number of charge and discharge cycles to calculate a remaining lifetime of the storage battery 14, but the present disclosure is not particularly limited thereto. The charge and discharge history storing section 231 may store various information concerning the performance of the storage battery 14 required for calculating a remaining lifetime of the storage battery 14. For example, the charge and discharge history storing section 231 may store SOC, SOH, a temperature, or a total electric discharge of the storage battery 14. Further, the history may be generated by measuring an electric current charged or discharged, or may be generated by measuring SOC or OCV (Open Circuit Voltage) properties of the battery.

The battery mechanical load history storing section 232 stores a history of mechanical load to the storage battery 14 of the mobile apparatus 1. The mechanical load indicates, for example, the number of shakings of the housing of the storage battery 14 of the mobile apparatus 1. The battery mechanical load history storing section 232 stores a history of the number of shakings of the housing of the storage battery 14 of the mobile apparatus 1.

The chemical remaining battery lifetime storing section 233 stores a chemical remaining battery lifetime calculated on the basis of a charge and discharge history of the storage battery 14.

The mechanical remaining battery lifetime storing section 234 stores a mechanical remaining battery lifetime calculated on the basis of a mechanical load to the storage battery 14.

The remaining battery lifetime storing section 235 stores a remaining battery lifetime indicative of a remaining lifetime of the storage battery 14.

The mobile apparatus basic information storing section 236 stores mobile apparatus basic information including a type of the mobile apparatus 1, a use mode of the mobile apparatus 1, and a use record of the mobile apparatus 1. The type of the mobile apparatus 1 is information indicating whether the mobile apparatus is an electric kick scooter, an electric bicycle, or an electric car. The use mode of the mobile apparatus 1 is information indicating whether the mobile apparatus 1 is used by an individual user, is shared by a plurality of users, or is shared by a plurality of employees of a company. The use record of the mobile apparatus 1 is information indicating a region or a country where the mobile apparatus 1 is used. The road condition is variable according to the region or the country. Therefore, the lifetime of the body of the mobile apparatus 1 is liable to vary according to the region or the country in which the mobile apparatus 1 is used. Therefore, the information indicative of a region or a country where the mobile apparatus 1 is used is utilized for calculating a remaining lifetime of the body of the mobile apparatus 1.

The manager of the mobile apparatus 1 records the type of the mobile apparatus 1, the use mode of the mobile apparatus 1, and the use record of the mobile apparatus 1 in the mobile apparatus basic information storing section 236 using the information terminal 3.

The initial body lifetime storing section 237 stores an initial lifetime of the body of the mobile apparatus 1 calculated on the basis of a type of the mobile apparatus 1, a use mode of the mobile apparatus 1, and a use record of the mobile apparatus 1.

The body mechanical load history storing section 238 stores a history of mechanical load to the body of the mobile apparatus 1. The mechanical load is represented by, for example, the number of shakings of the body of the mobile apparatus 1. The body mechanical load history storing section 238 stores a history of the number of shakings of the body of the mobile apparatus 1.

The remaining body lifetime storing section 239 stores a remaining body lifetime indicative of a remaining lifetime of the body of the mobile apparatus 1.

The electric power consumption storing section 240 stores an electric power consumption of each of the functions consuming the electric power of the mobile apparatus 1. The electric power consumption storing section 240 stores in advance a standard value of an electric power consumption of each of the functions consuming the electric power of the mobile apparatus 1 as an initial value of the electric power consumption. A standard value of the electric power consumption is provided, for example, by a manufacturer of the mobile apparatus 1. The electric power consumption stored in the electric power consumption storing section 240 is updated with an actual value of the electric power consumption.

The actual electric power consumption value storing section 241 stores in advance an actual value of electric power consumption of each of the functions consuming the electric power of the mobile apparatus 1.

The lifetime shortening effect storing section 242 stores a lifetime shortening effect of each of the functions consuming the electric power of the mobile apparatus 1.

The processor 22 is, for example, a CPU. The processor 22 furnishes a body load acquiring section 221, a battery load acquiring section 222, a remaining body lifetime calculating section 223, a remaining battery lifetime calculating section 224, an actual electric power consumption value acquiring section 225, a lifetime shortening effect estimating section 226, a remaining lifetime comparing section 227, and an instruction section 228.

The body load acquiring section 221 acquires the body load data sent by the mobile apparatus 1 via the communication part 21. The body load acquiring section 221 acquires the body load data (first data) concerning the load applied to the body of the electric mobile apparatus 1. The body load acquiring section 221 stores the number of shakings of the body of the mobile apparatus 1 included in the acquired body load data in the body mechanical load history storing section 238.

The battery load acquiring section 222 acquires the battery load data sent by the mobile apparatus 1 via the communication part 21. The battery load acquiring section 222 acquires the battery load data (second data) concerning the performance of the storage battery (battery) 14 mounted on the mobile apparatus 1. The battery load acquiring section 222 stores the number of charge and discharge cycles of the storage battery 14 included in the acquired battery load data in the charge and discharge history storing section 231, and stores the number of shakings of the housing of the storage battery 14 included in the acquired battery load data in the battery mechanical load history storing section 232.

The remaining body lifetime calculating section 223 calculates a remaining lifetime of the body on the basis of the body load data (first data) acquired by the body load acquiring section 221. The remaining body lifetime calculating section 223 calculates an initial lifetime of the body of the mobile apparatus 1 on the basis of a type of the mobile apparatus 1, a use mode of the mobile apparatus 1, and a use record of the mobile apparatus 1 stored in the mobile apparatus basic information storing section 236. The memory 23 stores in advance a table associating a combination of a type of the mobile apparatus 1, a use mode of the mobile apparatus 1, and a use record of the mobile apparatus 1 with an initial lifetime. The remaining body lifetime calculating section 223 reads out from the memory 23 the initial lifetime associated with the combination of the type of the mobile apparatus 1, the use mode of the mobile apparatus 1, and the use record of the mobile apparatus 1. The initial lifetime is set on the basis of statistical data. The remaining body lifetime calculating section 223 calculates an initial lifetime of the body of the mobile apparatus 1 when calculating the remaining lifetime of the body of the mobile apparatus 1 for the first time. The remaining body lifetime calculating section 223 stores the calculated initial lifetime of the body of mobile apparatus 1 in the initial body lifetime storing section 237.

The remaining body lifetime calculating section 223 acquires the initial lifetime of the body stored in the initial body lifetime storing section 237, acquires a history of the number of shakings of the body stored in the body mechanical load history storing section 238, and calculates the remaining body lifetime on the basis of the acquired initial lifetime and history of the number of shakings of the body. The memory 23 stores in advance a function representing a relationship between the number of shakings of the body of the mobile apparatus 1 and a lifetime subtrahend. The remaining body lifetime calculating section 223 calculates a lifetime subtrahend on the basis of the number of shakings acquired from the body mechanical load history storing section 238, and calculates, as a remaining body lifetime, a value resulting from the subtraction of the lifetime subtrahend from the initial lifetime of the body. The remaining body lifetime may be expressed in the form of an amount of electric power, or may be expressed in the form of a remaining travel distance which the mobile apparatus 1 can travel up to. The remaining body lifetime may be expressed in the form of a remaining time which the mobile apparatus 1 can travel up to. The remaining body lifetime calculating section 223 stores the calculated remaining body lifetime in the remaining body lifetime storing section 239.

In the present Embodiment 1, the remaining body lifetime calculating section 223 calculates the remaining body lifetime on the basis of the initial lifetime of the body and the number of shakings of the body, but the present disclosure is not particularly limited thereto. The remaining body lifetime calculating section 223 may calculate a remaining body lifetime solely on the basis of the number of shakings of the body. The memory 23 stores in advance a function representing a relationship between the number of shakings of the body of the mobile apparatus 1 and a remaining body lifetime.

In the present Embodiment 1, the remaining body lifetime calculating section 223 calculates the remaining lifetime of the body on the basis of the initial lifetime of the body of the mobile apparatus 1 (the statistical lifetime of the mobile apparatus 1) and the number of shakings of the body (an impact received by the mobile apparatus 1), but the present disclosure is not particularly limited thereto. The body load data (first data) may include at least one of a travelled distance of the mobile apparatus 1 and an impact received by the mobile apparatus 1. The remaining body lifetime calculating section 223 may calculate the remaining lifetime of the body on the basis of the initial lifetime of the body of the mobile apparatus 1 (the statistical lifetime of the mobile apparatus 1) and at least one of the travelled distance of the mobile apparatus 1 and the number of shakings of the body (impact received by the mobile apparatus 1).

The remaining battery lifetime calculating section 224 calculates a remaining lifetime of the storage battery (battery) 14 on the basis of the battery load data (second data). The remaining battery lifetime calculating section 224 acquires a history of the number of charge and discharge cycles stored in the charge and discharge history storing section 231, and calculates a chemical remaining battery lifetime of the storage battery 14 on the basis of the acquired history of the number of charge and discharge cycles. There is a correlation between the number of charge and discharge cycles and a full charge capacity of the storage battery 14, and the full charge capacity decreases as the number of charge and discharge cycle increases. The memory 23 stores in advance a function representing a relationship between the number of charge and discharge cycles and a full charge capacity. The remaining battery lifetime calculating section 224 calculates a current full charge capacity of the storage battery 14 on the basis of the number of charge and discharge cycles acquired from the charge and discharge history storing section 231. The remaining battery lifetime calculating section 224 calculates, as a chemical remaining battery lifetime, a difference between the calculated current full charge capacity and a full charge capacity diagnosable as an end of battery life. The full charge capacity diagnosable as an end of battery life is, for example, 60% of the initial full charge capacity. The remaining battery lifetime calculating section 224 stores the calculated chemical remaining battery lifetime in the chemical remaining battery lifetime storing section 233.

The chemical remaining lifetime of the storage battery 14 may be expressed in the form of a remaining travel distance which the mobile apparatus 1 can travel up to. Specifically, the remaining battery lifetime calculating section 224 may convert a difference between the calculated current full charge capacity and a full charge capacity diagnosable as an end of a battery life into a remaining travel distance, and calculate the converted remaining travel distance as a chemical remaining battery lifetime. In this case, the memory 23 stores in advance a function representing a relationship between a full charge capacity and a remaining travel distance. The chemical remaining lifetime may be expressed in the form of a remaining time which the mobile apparatus 1 can travel up to.

In the present Embodiment 1, the remaining battery lifetime calculating section 224 calculates the chemical remaining battery lifetime using the number of charge and discharge cycles, but the present disclosure is not particularly limited thereto. The remaining battery lifetime calculating section 224 may calculate the chemical remaining battery lifetime using other information concerning the performance of the storage battery 14 such as the SOC, the SOH, the temperature, or the total electric discharge of the storage battery 14.

The remaining battery lifetime calculating section 224 acquires the number of shakings of the housing of the storage battery 14 stored in the battery mechanical load history storing section 232, and calculates the mechanical remaining battery lifetime of the storage battery 14 on the basis of the acquired number of shakings. The memory 23 stores in advance a function representing a relationship between the number of shakings of the housing of the storage battery 14 and a mechanical remaining battery lifetime. The remaining battery lifetime calculating section 224 calculates a mechanical remaining battery lifetime of the storage battery 14 on the basis of the number of shakings acquired from the battery mechanical load history storing section 232. The mechanical remaining battery lifetime is expressed with the same unit of measure as the chemical remaining battery lifetime. The mechanical remaining battery lifetime may be expressed in the form of an amount of electric power, or may be expressed in the form of a remaining travel distance which the mobile apparatus 1 can travel up to. Besides, the mechanical remaining battery lifetime may be expressed in the form of a remaining time which the mobile apparatus 1 can travel up to. The remaining battery lifetime calculating section 224 stores the calculated mechanical remaining battery lifetime in the mechanical remaining battery lifetime storing section 234.

The remaining battery lifetime calculating section 224 calculates, as the remaining battery lifetime, one of the chemical remaining battery lifetime stored in the chemical remaining battery lifetime storing section 233 and the mechanical remaining battery lifetime stored in the mechanical remaining battery lifetime storing section 234 which is shorter than the other, and stores it in the remaining battery lifetime storing section 235.

In the present Embodiment 1, the remaining battery lifetime calculating section 224 calculates the remaining battery lifetime on the basis of the chemical remaining battery lifetime and the mechanical remaining battery lifetime, but the present disclosure is not particularly limited thereto. The remaining battery lifetime calculating section 224 may calculate only the chemical remaining battery lifetime as the remaining battery lifetime, or may calculate only the mechanical remaining battery lifetime as the remaining battery lifetime. The battery load data (second data) includes a history of at least one of a charge, a discharge, a charge capacity, and a temperature of the storage battery (battery) 14. The remaining battery lifetime calculating section 224 may calculate the remaining lifetime of the storage battery (battery) 14 on the basis of a lifetime of the storage battery (battery) 14 and a deterioration level of the storage battery (battery) 14 calculated from the history of the storage battery (battery) 14.

The actual electric power consumption value acquiring section 225 acquires an actual value of electric power consumption of each function sent from the mobile apparatus 1 via the communication part 21. The actual electric power consumption value acquiring section 225 stores the acquired actual value of electric power consumption of each function in the actual electric power consumption value storing section 241.

The lifetime shortening effect estimating section 226 reads out an electric power consumption of each function from the electric power consumption storing section 240, reads out an actual value of electric power consumption of each function from the actual electric power consumption value storing section 241, and corrects the electric power consumption of each function using the actual value of electric power consumption of each function. For example, the lifetime shortening effect estimating section 226 replaces the electric power consumption of each function with the actual value of electric power consumption of each function. Further, for example, the lifetime shortening effect estimating section 226 may calculate an average value of the electric power consumption of each function and the actual value of electric power consumption of each function, and replace the electric power consumption of each function with the calculated average value. The lifetime shortening effect estimating section 226 stores the corrected electric power consumption of each function in the electric power consumption storing section 240.

The lifetime shortening effect estimating section 226 may correct the electric power consumption of each function using an actual value of electric power consumption of each function acquired from another mobile apparatus of the same type as the mobile apparatus 1. In this case, the communication part 21 acquires the actual value of electric power consumption of each function measured in another mobile apparatus of the same type as the mobile apparatus 1.

Further, the lifetime shortening effect estimating section 226 estimates a lifetime shortening effect of each function on the basis of an electric power consumption of each function. The lifetime shortening effect refers to a length of lifetime which can be shortened when an unused function is activated or a used function is enhanced. The memory 23 stores in advance a function associating an electric power consumption with a lifetime shortening effect. The lifetime shortening effect estimating section 226 estimates the lifetime shortening effect of each function on the basis of the electric power consumption of each function using the function. The lifetime shortening effect estimating section 226 stores the estimated lifetime shortening effect of each function in the lifetime shortening effect storing section 242.

The lifetime shortening effect estimating section 226 corrects the electric power consumption of each function stored in the electric power consumption storing section 240 using the actual value of electric power consumption of each function stored in the actual electric power consumption value storing section 241, but the present disclosure is not particularly limited thereto. The lifetime shortening effect estimating section 226 may estimate the lifetime shortening effect of each function solely on the basis of the actual value of electric power consumption of each function stored in the actual electric power consumption value storing section 241. In this case, the server 2 is not required to store in advance a standard value of electric power consumption of each function, and thus can reduce the occupied storage capacity in the memory 23. Further, the lifetime shortening effect estimating section 226 may estimate the lifetime shortening effect of each function solely on the basis of the standard value of electric power consumption of each function stored in the electric power consumption storing section 240. In this case, the mobile apparatus 1 is not required to measure an actual value of electric power consumption of each function, and thus can reduce the processing load for the mobile apparatus 1 and the server 2.

The remaining lifetime comparing section 227 compares the remaining lifetime of the body with the remaining lifetime of the storage battery (battery) 14. The remaining lifetime comparing section 227 compares the remaining body lifetime stored in the remaining body lifetime storing section 239 with the remaining battery lifetime stored in the remaining battery lifetime storing section 235.

When the remaining lifetime of the body is shorter than the remaining lifetime of the storage battery (battery) 14, the instruction section 228 instructs at least one of an activation of an unused function and an enhancement of a used function among a plurality of functions consuming the electric power of the mobile apparatus 1.

The instruction section 228 has a function presenting portion 251, a function determining portion 252, and an instruction notifying portion 253.

The function presenting portion 251 causes the information terminal 3 (presentation device) to present at least one of an activation of an unused function and an enhancement of a used function.

More specifically, the function presenting portion 251 acquires at least one of a type of the mobile apparatus 1, a use mode of the mobile apparatus 1, and a use record of the mobile apparatus 1. The function presenting portion 251 determines at least one candidate of a function to be activated and a function to be enhanced in accordance with the acquired at least one of the type, use mode, and use record of the mobile apparatus 1. Here, the function presenting portion 251 may calculate a difference between the remaining lifetime of the storage battery (battery) 14 and the remaining lifetime of the body, and determine at least one candidate of a function to be activated and a function to be enhanced in accordance with the difference. Thereafter, the function presenting portion 251 causes the information terminal 3 (presentation device) to present the determined candidate. The function presenting portion 251 sends a list of the determined candidate to the information terminal 3.

Further, the function presenting portion 251 may determine a priority degree of the presentation of at least one of a function to be activated and a function to be enhanced in accordance with the acquired at least one of the type, use mode, and use record of the mobile apparatus 1. The function presenting portion 251 may cause the information terminal 3 (presentation device) to present at least one of an activation of an unused function and an enhancement of a used function in accordance with the determined priority degree.

The function presenting portion 251 sends to the information terminal 3 via the communication part 21 function presenting information showing a list of the at least one candidate of a function to be activated and a function to be enhanced. Further, the communication part 21 receives a response to the presentation sent from the information terminal 3.

The function determining portion 252 determines at least one of the function to be activated and the function to be enhanced on the basis of the response to the presentation.

The instruction notifying portion 253 sends to the mobile apparatus 1 via the communication part 21 a notification instructing the determined at least one of the activation of the function and the enhancement of the function.

Figure 4:
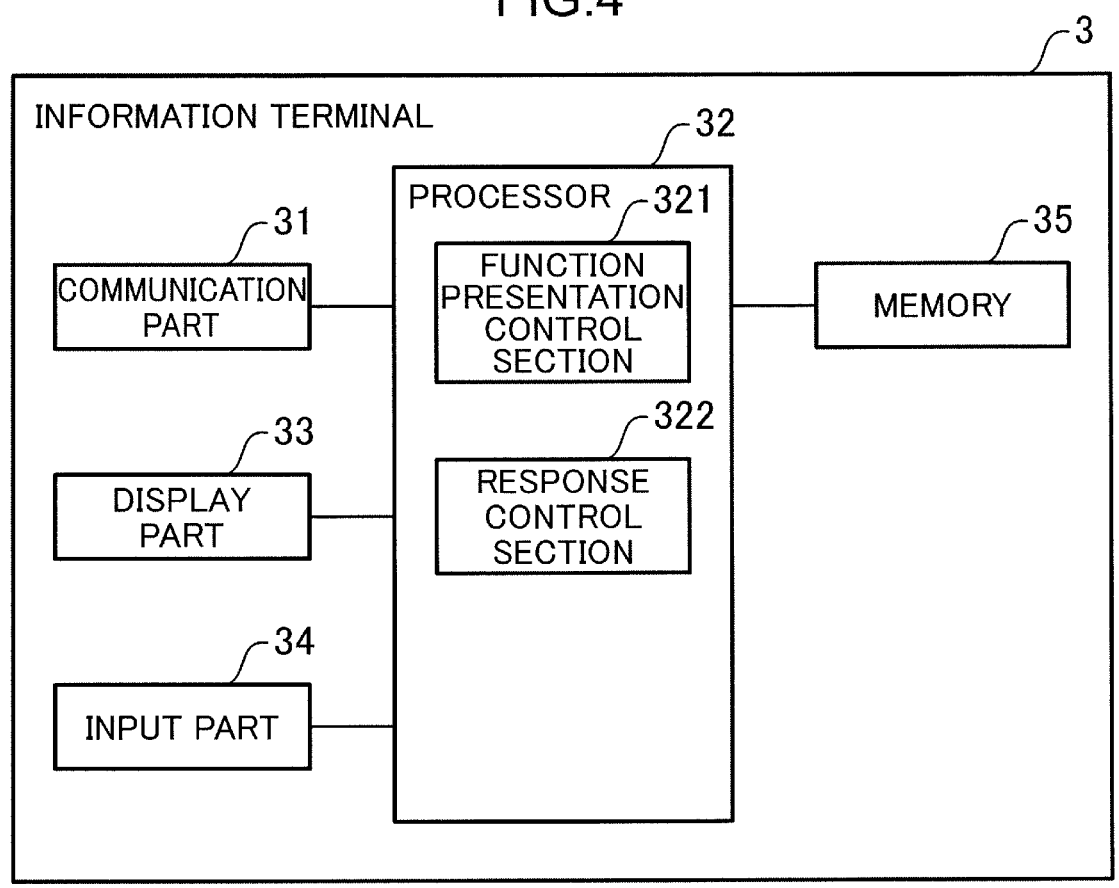
FIG. 4 is a diagram showing an exemplary configuration of an information terminal according to Embodiment 1 of the present disclosure.

FIG. 4 is a diagram showing an exemplary configuration of an information terminal according to Embodiment 1 of the present disclosure.

The information terminal 3 shown in FIG. 4 includes a communication part 31, a processor 32, a display part 33, an input part 34, and a memory 35.

The communication part 31 sends information to the server 2, and receives information from the server 2. The communication part 31 receives from the server 2 function presenting information showing a list of the at least one candidate of the function to be activated and the function to be enhanced. Further, the communication part 31 sends to the server 2 response information indicative of the at least one of the function to be activated and the function to be enhanced which is selected by the manager of the mobile apparatus 1.

The display part 33 is, for example, a liquid crystal display device, and displays the function presenting information.

The memory 35 is, for example, a storage device capable of storing a variety of information, e.g., RAM, SSD, or Flash Memory.

The processor 32 is, for example, a CPU. The processor 32 furnishes a function presentation control section 321 and a response control section 322.

The function presentation control section 321 causes the display part 33 to display the function presenting information received by the communication part 31. The manager selects a desired function among the list of the at least one candidate of the function to be activated and the function to be enhanced.

The input part 34 is, for example, a touch screen, and receives an input of a variety of information by the manager. The input part 34 receives a selection by the manager of at least one of a function to be activated and a function to be enhanced among a list of at least one candidate of a function to be activated and a function to be enhanced.

The response control section 322 sends to the server 2 via the communication part 21 response information indicative of the at least one of the function to be activated and the function to be enhanced which is selected by the manager.

Hereinafter, a process of calculating the remaining battery lifetime in Embodiment 1 of the present disclosure will be described.

Figure 5:
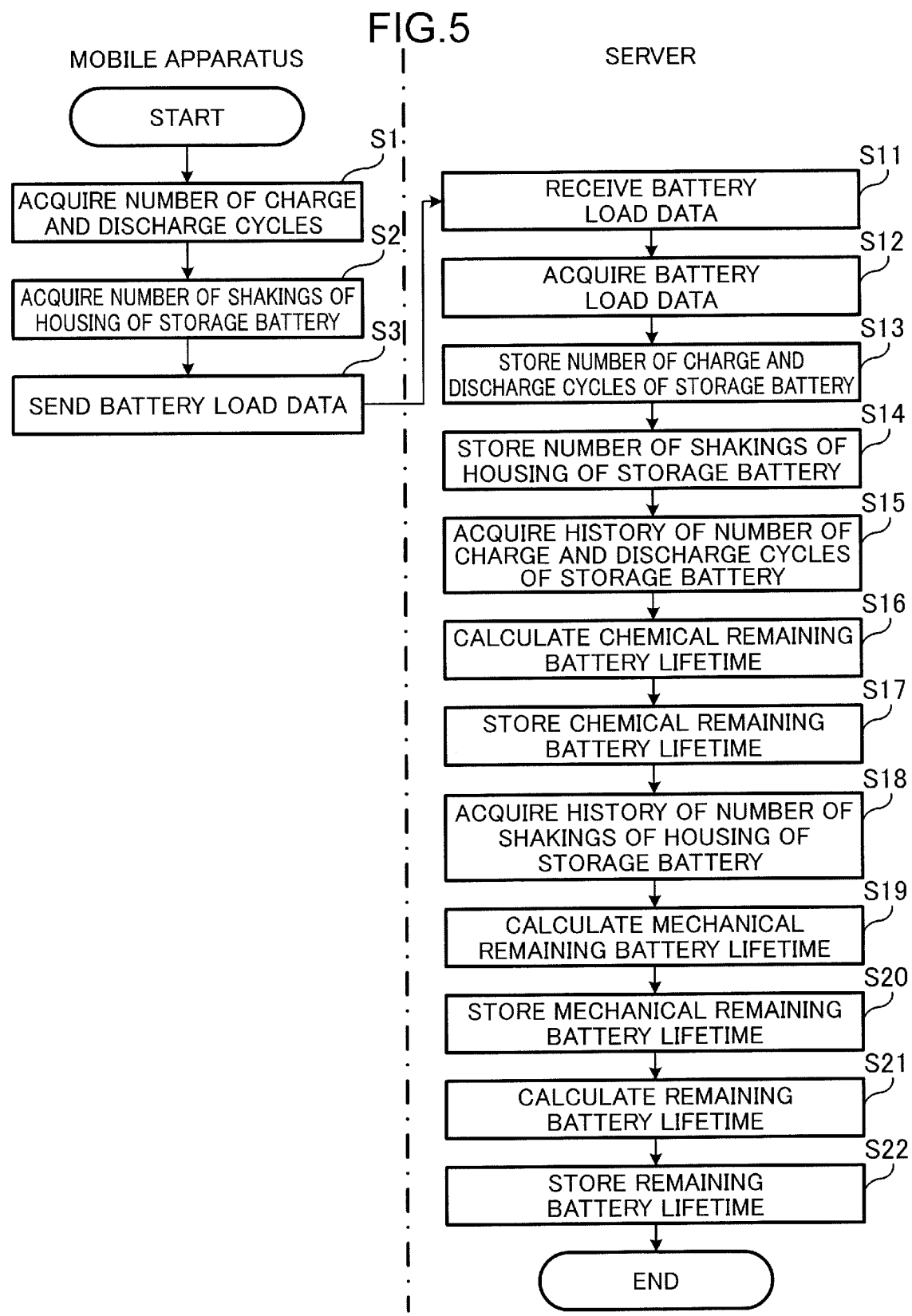
FIG. 5 is a flowchart showing a process of calculating a remaining battery lifetime in Embodiment 1 of the present disclosure.

FIG. 5 is a flowchart showing a process of calculating a remaining battery lifetime in Embodiment 1 of the present disclosure.

First, in Step S1, the battery state acquiring section 153 of the mobile apparatus 1 acquires from the memory 18 the number of charge and discharge cycles of the storage battery 14. The number of charge and discharge cycles denotes a cumulative value of the number of charge and discharge cycles from the production of the mobile apparatus 1 up to the present. The memory 18 stores the number of charge and discharge cycles of the storage battery 14. The battery state acquiring section 153 acquires from the memory 18 the number of charge and discharge cycles of the storage battery 14 at a specific timing. The specific timing is, for example, every one minute or every ten minutes.

Thereafter, in Step S2, the battery load sending control section 155 acquires from the memory 18 the number of shakings of the housing of the storage battery 14. The number of shakings denotes a cumulative value of the number of shakings of the housing of the storage battery 14 from the production of the mobile apparatus 1 up to the present. The memory 18 stores the number of shakings of the housing of the storage battery 14.

Thereafter, in Step S3, the battery load sending control section 155 sends to the server 2 via the communication part 19 battery load data concerning the performance of the storage battery 14 mounted on the mobile apparatus 1. The battery load data includes the number of charge and discharge cycles of the storage battery 14 and the number of shakings of the housing of the storage battery 14.

Thereafter, in Step S11, the communication part 21 of the server 2 receives the battery load data sent from the mobile apparatus 1.

Subsequently, in Step S12, the battery load acquiring section 222 acquires the battery load data received by the communication part 21.

Subsequently, in Step S13, the battery load acquiring section 222 stores in the charge and discharge history storing section 231 the number of charge and discharge cycles of the storage battery 14 included in the acquired battery load data.

Next, in Step S14, the battery load acquiring section 222 stores in the battery mechanical load history storing section 232 the number of shakings of the housing of the storage battery 14 included in the acquired battery load data.

Next, in Step S15, the remaining battery lifetime calculating section 224 acquires a history of the number of charge and discharge cycles of the storage battery 14 stored in the charge and discharge history storing section 231.

Next, in Step S16, the remaining battery lifetime calculating section 224 calculates a chemical remaining battery lifetime of the storage battery 14 on the basis of the acquired history of the number of charge and discharge cycles.

Thereafter, in Step S17, the remaining battery lifetime calculating section 224 stores the calculated chemical remaining battery lifetime in the chemical remaining battery lifetime storing section 233.

Thereafter, in Step S18, the remaining battery lifetime calculating section 224 acquires the number of shakings of the housing of the storage battery 14 stored in the battery mechanical load history storing section 232.

Thereafter, in Step S19, the remaining battery lifetime calculating section 224 calculates the mechanical remaining battery lifetime of the storage battery 14 on the basis of the acquired number of shakings of the housing of the storage battery 14.

Thereafter, in Step S20, the remaining battery lifetime calculating section 224 stores the calculated mechanical remaining battery lifetime in the mechanical remaining battery lifetime storing section 234.

Subsequently, in Step S21, the remaining battery lifetime calculating section 224 calculates, as the remaining battery lifetime, one of the chemical remaining battery lifetime stored in the chemical remaining battery lifetime storing section 233 and the mechanical remaining battery lifetime stored in the mechanical remaining battery lifetime storing section 234 which is shorter than the other.

Subsequently, in Step S22, the remaining battery lifetime calculating section 224 stores the calculated remaining battery lifetime in the remaining battery lifetime storing section 235.

Hereinafter, a process of calculating the remaining body lifetime in Embodiment 1 of the present disclosure will be described.

Figure 6:
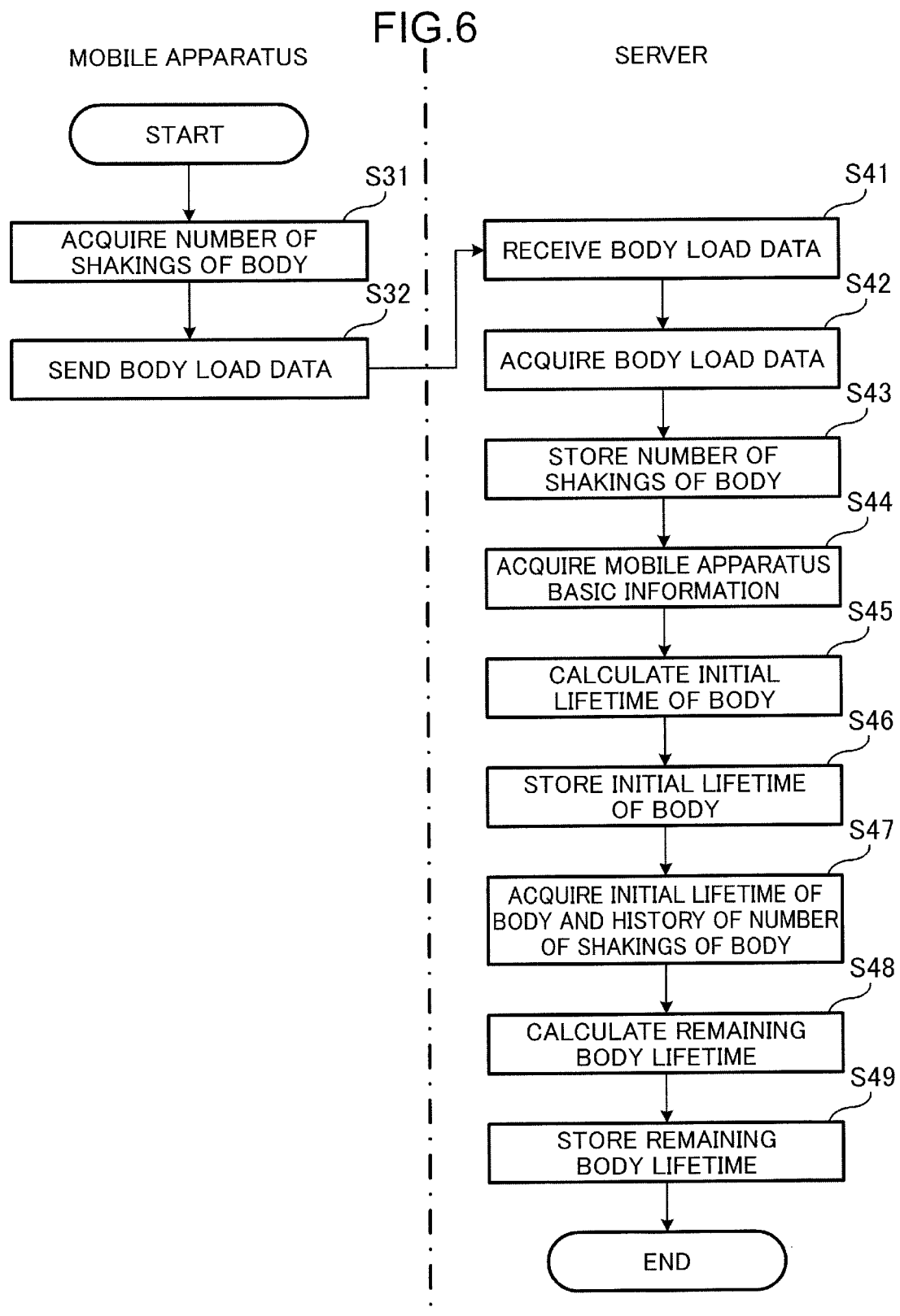
FIG. 6 is a flowchart showing a process of calculating a remaining body lifetime in Embodiment 1 of the present disclosure.

FIG. 6 is a flowchart showing a process of calculating a remaining body lifetime in Embodiment 1 of the present disclosure.

First, in Step S31, the body load sending control section 154 acquires from the memory 18 the number of shakings of the body of the mobile apparatus 1. The number of shakings denotes a cumulative value of the number of shakings of the body from the production of the mobile apparatus 1 up to the present. The memory 18 stores the number of shakings of the body of the mobile apparatus 1. The body load sending control section 154 acquires from the memory 18 the number of shakings of the body of the mobile apparatus 1 at a specific timing. The specific timing is, for example, every one minute or every ten minutes.

Thereafter, in Step S32, the body load sending control section 154 sends to the server 2 via the communication part 19 body load data concerning a load applied to the body of the electric mobile apparatus 1. The body load data includes the number of shakings of the body of the mobile apparatus 1.

Thereafter, in Step S41, the communication part 21 of the server 2 receives the body load data sent from the mobile apparatus 1.

Thereafter, in Step S42, the body load acquiring section 221 acquires the body load data received by the communication part 21.

Thereafter, in Step S43, the body load acquiring section 221 stores the number of shakings of the body of the mobile apparatus 1 included in the acquired body load data in the body mechanical load history storing section 238.

Subsequently, in Step S44, the remaining body lifetime calculating section 223 acquires mobile apparatus basic information from the mobile apparatus basic information storing section 236. The mobile apparatus basic information includes a type of the mobile apparatus 1, a use mode of the mobile apparatus 1, and a use record of the mobile apparatus 1.

Thereafter, in Step S45, the remaining body lifetime calculating section 223 calculates an initial lifetime of the body of the mobile apparatus 1 on the basis of the type of the mobile apparatus 1, the use mode of the mobile apparatus 1, and the use record of the mobile apparatus 1 acquired from the mobile apparatus basic information storing section 236.

Subsequently, in Step S46, the remaining body lifetime calculating section 223 stores the calculated initial lifetime of the body of mobile apparatus 1 in the initial body lifetime storing section 237.

The processings from Steps S44 to S46 are required to be executed only in the first calculation of the remaining body lifetime, and may be omitted in the second or subsequent calculation of the remaining body lifetime.

Subsequently, in Step S47, the remaining body lifetime calculating section 223 acquires the initial lifetime of the body stored in the initial body lifetime storing section 237, and acquires the history of the number of shakings of the body stored in the body mechanical load history storing section 238.

Subsequently, in Step S48, the remaining body lifetime calculating section 223 calculates the remaining body lifetime on the basis of the acquired initial lifetime of the body and history of the number of shakings of the body.

Next, in Step S49, the remaining body lifetime calculating section 223 stores the calculated remaining body lifetime in the remaining body lifetime storing section 239.

Hereinafter, the process of estimating a lifetime shortening effect of each of a plurality of functions in Embodiment 1 of the present disclosure will be described.

Figure 7:
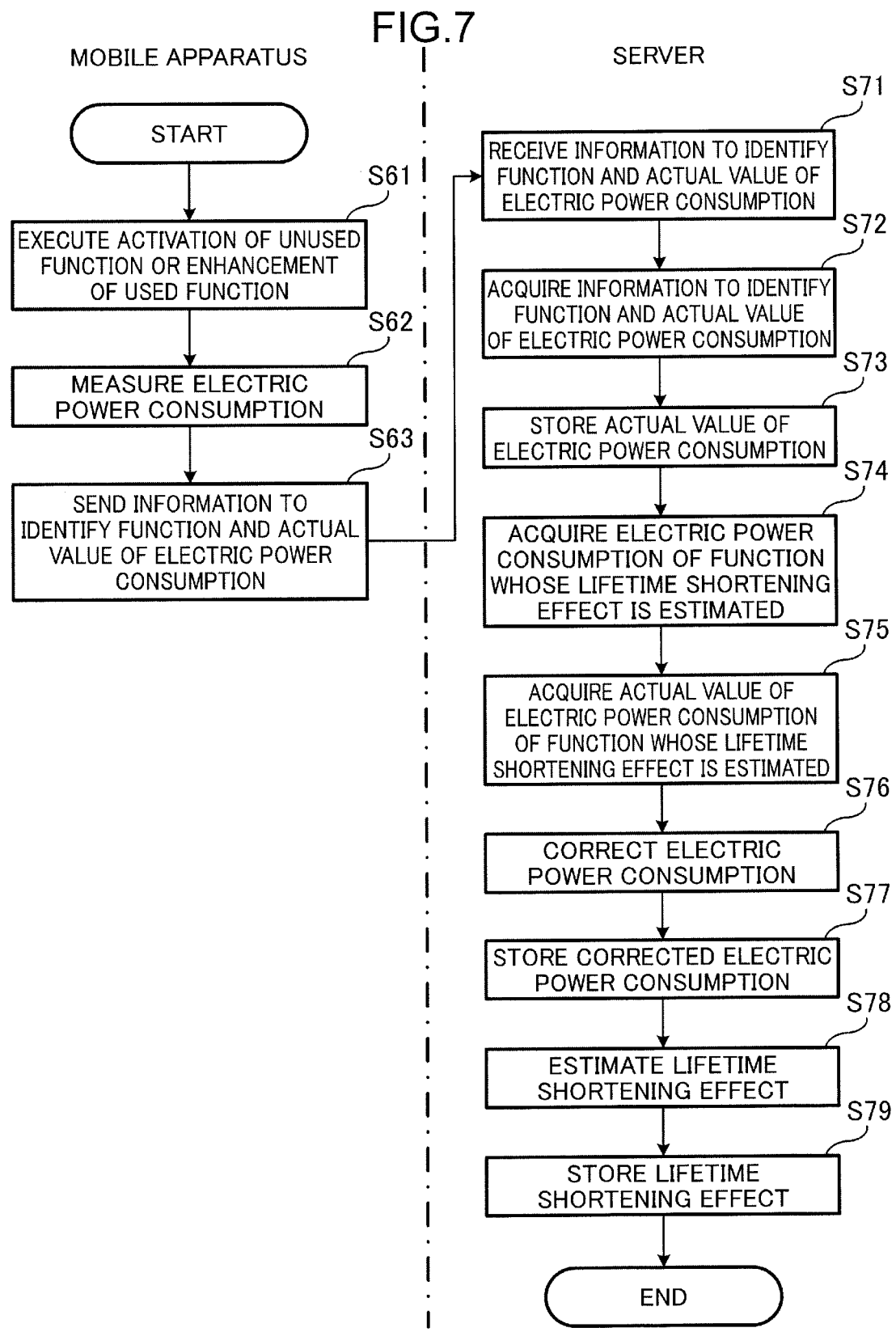
FIG. 7 is a flowchart showing a process of estimating a lifetime shortening effect of each of a plurality of functions in Embodiment 1 of the present disclosure.

FIG. 7 is a flowchart showing a process of estimating a lifetime shortening effect of each of a plurality of functions in Embodiment 1 of the present disclosure.

First, in Step S61, the drive control section 151 of the mobile apparatus 1 executes an activation of an unused function or an enhancement of a used function to estimate a lifetime shortening effect. The drive control section 151 enhances, for example, the used function of controlling the acceleration among the functions consuming the electric power.

It may be appreciated that the drive control section 151 executes an activation of an unused function or an enhancement of a used function in a measurement mode suitable to obtain an actual value of electric power consumption. For example, it may be appreciated that the drive control section 151 receives a selection, by the driver, of a function to be activated or a function to be enhanced in the measurement mode, and executes the selected activation of a function or enhancement of a function.

Subsequently, in Step S62, the actual electric power consumption value measuring section 156 measures an electric power consumption in the case of activating an unused function, or an electric power consumption in the case of enhancing a used function. For example, the actual electric power consumption value measuring section 156 measures an electric power consumption in the case of enhancing the used function of controlling the acceleration.

Subsequently, in Step S63, the communication part 19 sends to the server 2 information to identify an activated function or an enhanced function, and the actual value of electric power consumption measured by the actual electric power consumption value measuring section 156.

Thereafter, in Step S71, the communication part 21 of the server 2 receives the information to identify an activated function or an enhanced function and the actual value of electric power consumption sent from the mobile apparatus 1.

Subsequently, in Step S72, the actual electric power consumption value acquiring section 225 acquires the information to identify an activated function or an enhanced function and the actual value of electric power consumption received by the communication part 21.

Thereafter, in Step S73, the actual electric power consumption value acquiring section 225 stores in the actual electric power consumption value storing section 241 the information to identify an activated function or an enhanced function and the actual value of electric power consumption in association with each other.

Thereafter, in Step S74, the lifetime shortening effect estimating section 226 acquires from the electric power consumption storing section 240 the electric power consumption of the function activated or enhanced in the measurement of the actual value of electric power consumption, i.e., the function whose lifetime shortening effect is estimated.

Subsequently, in Step S75, the lifetime shortening effect estimating section 226 acquires from the actual electric power consumption value storing section 241 the actual value of electric power consumption of the function activated or enhanced in the measurement of the actual value of electric power consumption, i.e., the function whose lifetime shortening effect is estimated.

Subsequently, in Step S76, the lifetime shortening effect estimating section 226 corrects the electric power consumption of the function whose lifetime shortening effect is estimated using the actual value of electric power consumption of the function whose lifetime shortening effect is estimated.

Next, in Step S77, the lifetime shortening effect estimating section 226 stores the corrected electric power consumption in the electric power consumption storing section 240.

Next, in Step S78, the lifetime shortening effect estimating section 226 estimates a lifetime shortening effect on the basis of the corrected electric power consumption.

Thereafter, in Step S79, the lifetime shortening effect estimating section 226 stores in the lifetime shortening effect storing section 242 the estimated lifetime shortening effect in association with the information to identify an activated function or an enhanced function.

The flow may return to Step S61 when there is, after the storage of the lifetime shortening effect, a function whose lifetime shortening effect is still to be estimated among the functions. The processings from Step S61 to Step S79 may be repeated until lifetime shortening effects of all the functions are estimated.

Hereinafter, the process of comparing a remaining body lifetime with a remaining battery lifetime in Embodiment 1 of the present disclosure will be described.

Figure 8:
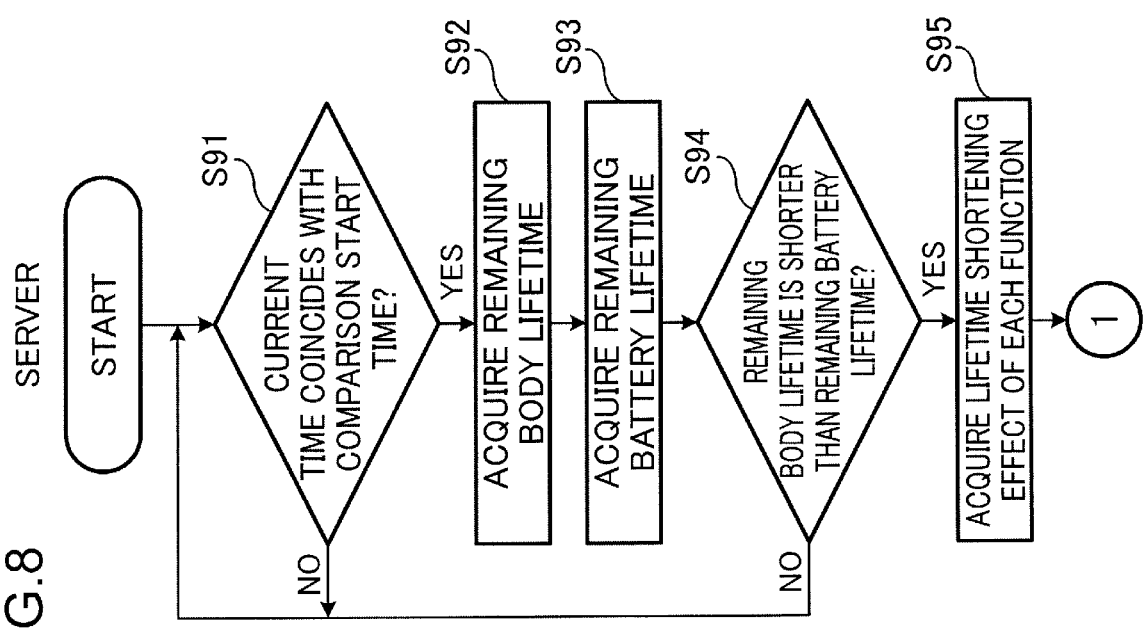
FIG. 8 is a first flowchart showing a process of comparing the remaining body lifetime with the remaining battery lifetime in Embodiment 1 of the present disclosure.
Figure 9:
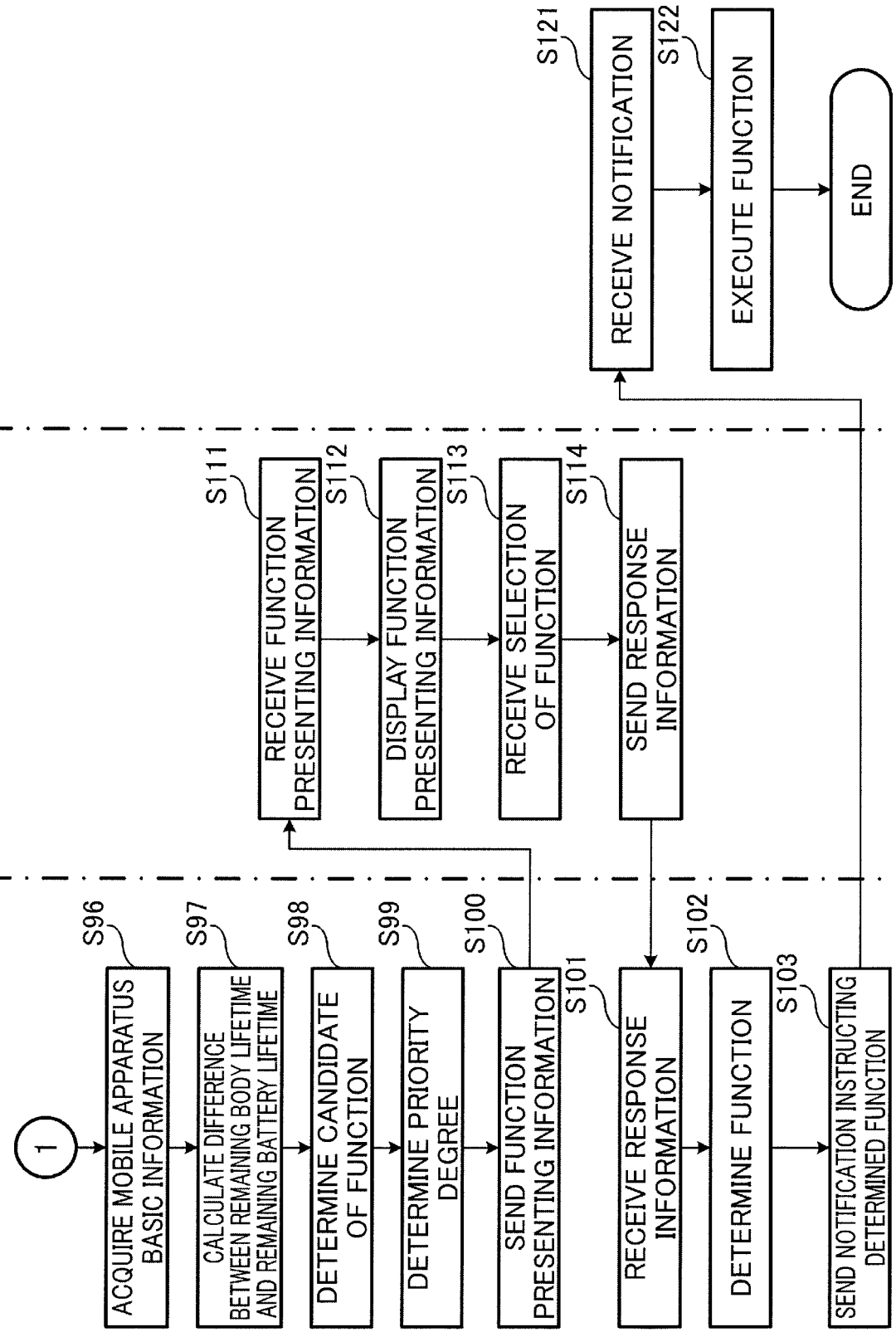
FIG. 9 is a second flowchart showing a process of comparing the remaining body lifetime with the remaining battery lifetime in Embodiment 1 of the present disclosure.

FIG. 8 is a first flowchart showing a process of comparing the remaining body lifetime with the remaining battery lifetime in Embodiment 1 of the present disclosure. FIG. 9 is a second flowchart showing a process of comparing the remaining body lifetime with the remaining battery lifetime in Embodiment 1 of the present disclosure.

First, in Step S91, the remaining lifetime comparing section 227 of the server 2 judges whether the current time coincides with a comparison start time at which the remaining body lifetime is compared with the remaining battery lifetime. The comparison start time is, for example, one specific time a month, or a maintenance start time of the mobile apparatus 1.

Here, when it is judged that the current time does not coincide with the comparison start time (NO in Step S91), the flow returns to Step S91, and the processing of judgement in Step S91 is repeated until the current time coincides with the comparison start time.

On the other hand, when it is judged that the current time coincides with the comparison start time (YES in Step S91), in Step S92, the remaining lifetime comparing section 227 acquires the remaining body lifetime stored in the remaining body lifetime storing section 239.

Subsequently, in Step S93, the remaining lifetime comparing section 227 acquires the remaining battery lifetime stored in the remaining battery lifetime storing section 235.

Subsequently, in Step S94, the remaining lifetime comparing section 227 compares the remaining body lifetime with the remaining battery lifetime, and judges whether the remaining body lifetime is shorter than the remaining battery lifetime.

Here, the flow returns to Step S91 when it is judged that the remaining body lifetime is not shorter than the remaining battery lifetime, i.e., when it is judged that the remaining body lifetime is equal to or longer than the remaining battery lifetime (NO in Step S94).

On the other hand, when it is judged that the remaining body lifetime is shorter than the remaining battery lifetime (YES in Step S94), in Step S95, the function presenting portion 251 acquires the lifetime shortening effect of each function from the lifetime shortening effect storing section 242.

Subsequently, in Step S96, the function presenting portion 251 acquires the mobile apparatus basic information from the mobile apparatus basic information storing section 236. The mobile apparatus basic information includes a type of the mobile apparatus 1, a use mode of the mobile apparatus 1, and a use record of the mobile apparatus 1.

Subsequently, in Step S97, the function presenting portion 251 calculates a difference between the remaining body lifetime and the remaining battery lifetime.

Thereafter, in Step S98, the function presenting portion 251 determines at least one candidate of a function to be activated and a function to be enhanced on the basis of the lifetime shortening effect, the mobile apparatus basic information, and the difference between the remaining body lifetime and the remaining battery lifetime.

Here, the function presenting portion 251 selects, among the functions, a function appropriate for the type of the mobile apparatus included in the mobile apparatus basic information. Thereafter, the function presenting portion 251 selects, among the selected functions, a function appropriate for a use mode. Specifically, in a certain use mode, the use of a function is permitted, whereas the use of another function is not permitted. Accordingly, the function presenting portion 251 further selects, among the selected functions, a function appropriate for the use mode. Thereafter, the function presenting portion 251 selects, among the selected functions, a function having a lifetime shortening effect shorter than a difference between the remaining body lifetime and the remaining battery lifetime. The function presenting portion 251 determines the selected function as a candidate.

Thereafter, in Step S99, the function presenting portion 251 determines a priority degree of the presentation of at least one of a function to be activated and a function to be enhanced in accordance with at least one of the type, use mode, and use record of the mobile apparatus 1 included in the mobile apparatus basic information. For example, the use record includes information indicating how the mobile apparatus 1 is used. In a mobile apparatus 1 where the headlamp 13 is turned on only few times, the function of increasing the luminance of the headlamp 13 has a lower priority degree. In a mobile apparatus 1 which is not accelerated to more than a predetermined speed, the function of enhancing the acceleration performance has a lower priority degree. A priority degree of each function may be determined in advance according to a type of the mobile apparatus or a use mode of the mobile apparatus.

Subsequently, in Step S100, the function presenting portion 251 sends to the information terminal 3 via the communication part 21 the function presenting information showing the list of the at least one candidate of a function to be activated and a function to be enhanced.

Thereafter, in Step S111, the communication part 31 of the information terminal 3 receives the function presenting information sent from the server 2.

Thereafter, in Step S112, the function presentation control section 321 causes the display part 33 to display the function presenting information received by the communication part 31.

FIG. 10 is an illustration showing exemplary function presenting information in Embodiment 1 of the present disclosure.

The display part 33 displays the function presenting information showing the list of the at least one candidate of a function to be activated and a function to be enhanced. When the mobile apparatus 1 is in the use mode where the mobile apparatus 1 is shared by the users, the function presenting information shown in FIG. 10 is displayed. The function presenting portion 251 of the server 2 has selected the function of controlling the luminance, the function of performing communications, and the function of controlling the acceleration. Further, the function of controlling the luminance has the highest priority degree, the function of performing communications has the second highest priority degree, and the function of controlling the acceleration has the third highest priority degree. The function of controlling the luminance, the function of performing communications, and the function of controlling the acceleration are displayed in a descending order of priority degree.

Additionally, the function presenting information includes an electric power consumption in the case of enhancing the function of controlling the luminance, an electric power consumption in the case of activating the function of performing communications, and an electric power consumption in the case of enhancing the function of controlling the acceleration. The display part 33 may display the function of controlling the luminance, the function of performing communications, and the function of controlling the acceleration in a descending order of electric power consumption. Further, the function presenting information includes a checkbox 331 for receiving a selection by the manager of the at least one of a function to be activated and a function to be enhanced. When the checkbox 331 corresponding to a desired function is touched by the manager, the display part 33 causes a checkmark to be displayed in the checkbox 331.

Figure 11:
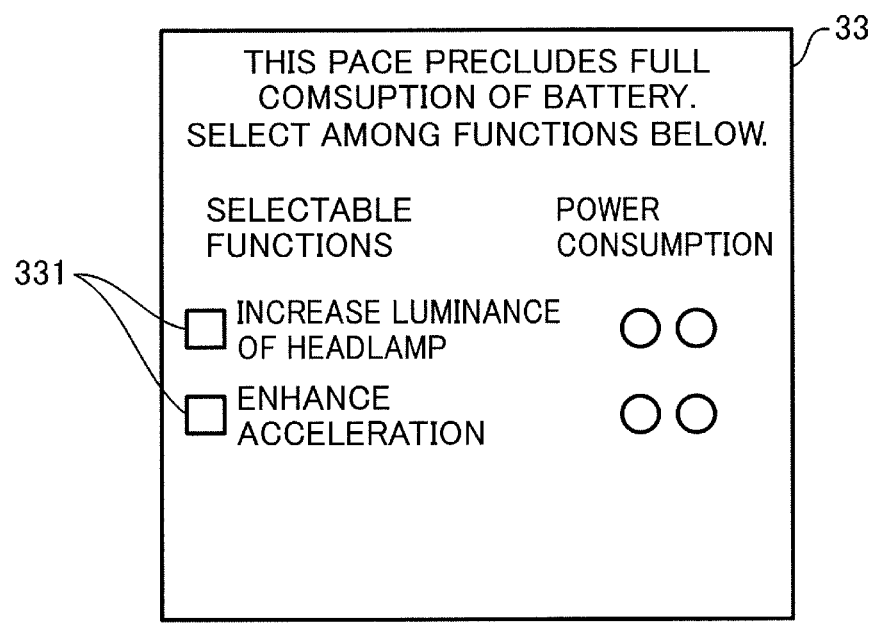
FIG. 11 is an illustration showing exemplary function presenting information in Modification 1 of Embodiment 1 of the present disclosure.

FIG. 11 is an illustration showing exemplary function presenting information in Modification 1 of Embodiment 1 of the present disclosure.

When the mobile apparatus 1 is in the use mode where the mobile apparatus 1 is shared by the employees of a company, the function presenting information shown in FIG. 11 is displayed. The function presenting portion 251 of the server 2 has selected the function of controlling the luminance and the function of controlling the acceleration. Further, the function of controlling the luminance has the highest priority degree, and the function of controlling the acceleration has the second highest priority degree. The function of controlling the luminance and the function of controlling the acceleration are displayed in a descending order of priority degree.

Additionally, the function presenting information includes an electric power consumption in the case of enhancing the function of controlling the luminance and an electric power consumption in the case of enhancing the function of controlling the acceleration. The display part 33 may display the function of controlling the luminance and the function of controlling the acceleration in a descending order of electric power consumption. Further, the function presenting information includes a checkbox 331 for receiving a selection by the manager of a function to be enhanced. When the checkbox 331 corresponding to a desired function is touched by the manager, the display part 33 causes a checkmark to be displayed in the checkbox 331.

Figure 12:
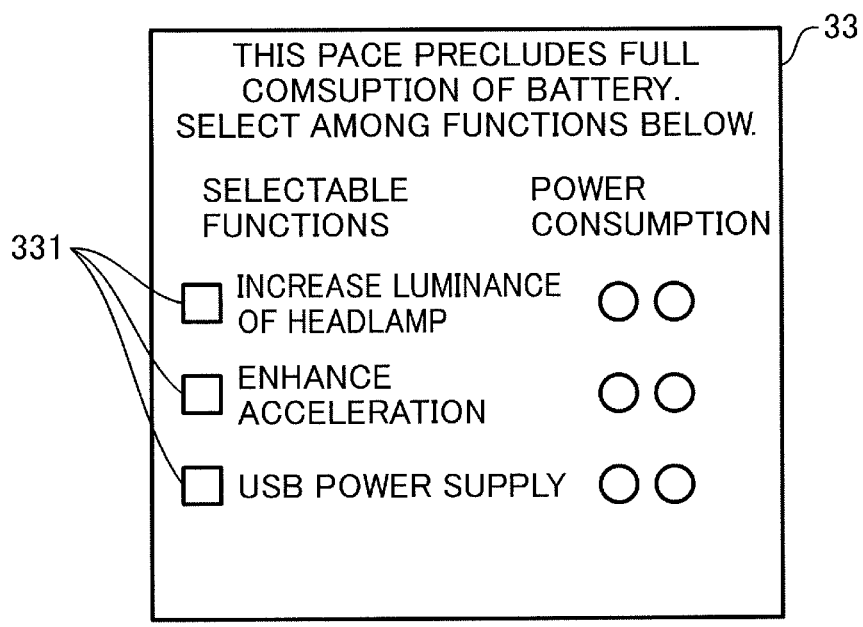
FIG. 12 is an illustration showing exemplary function presenting information in Modification 2 of Embodiment 1 of the present disclosure.

FIG. 12 is an illustration showing exemplary function presenting information in Modification 2 of Embodiment 1 of the present disclosure.

When the mobile apparatus 1 is in the use mode where the mobile apparatus 1 is used by an individual user, the function presenting information shown in FIG. 12 is displayed. The function presenting portion 251 of the server 2 has selected the function of controlling the luminance, the function of controlling the acceleration, and the function of supplying an electric power. Further, the function of controlling the luminance has the highest priority degree, the function of controlling the acceleration has the second highest priority degree, and the function of supplying an electric power has the third highest priority degree. The function of controlling the luminance, the function of controlling the acceleration, and the function of supplying an electric power are displayed in a descending order of priority degree.

Additionally, the function presenting information includes an electric power consumption in the case of enhancing the function of controlling the luminance, an electric power consumption in the case of enhancing the function of controlling the acceleration, and an electric power consumption in the case of activating the function of supplying an electric power. The display part 33 may display the function of controlling the luminance, the function of controlling the acceleration, and the function of supplying an electric power in a descending order of electric power consumption. Further, the function presenting information includes a checkbox 331 for receiving a selection by the manager of at least one of a function to be activated and a function to be enhanced. When the checkbox 331 corresponding to a desired function is touched by the manager, the display part 33 causes a checkmark to be displayed in the checkbox 331.

Referring again to FIG. 9, next, in Step S113, the function presentation control section 321 receives a selection by the manager of a function. The manager selects at least one of a function to be activated and a function to be enhanced using the input part 34. Although a plurality of functions is selectable, when a sum of the lifetime shortening effects of the plurality of functions is greater than a difference between the remaining body lifetime and the remaining battery lifetime, the function presentation control section 321 rejects the selection of the plurality of functions, and when a sum of the lifetime shortening effects of the plurality of functions is equal to or smaller than the difference between the remaining body lifetime and the remaining battery lifetime, the function presentation control section 321 receives the selection of the plurality of functions.

Subsequently, in Step S114, the response control section 322 sends to the server 2 via the communication part 31 response information to identify the selected function.

Thereafter, in Step S101, the communication part 21 of the server 2 receives the response information sent from the information terminal 3.

Thereafter, in Step S102, the function determining portion 252 determines at least one of the function to be activated and the function to be enhanced on the basis of the response information.

Thereafter, in Step S103, the instruction notifying portion 253 sends to the mobile apparatus 1 via the communication part 21 a notification instructing the at least one of the activation of the function and the enhancement of the function which is determined by the function determining portion 252.

Subsequently, in Step S121, the communication part 19 of the mobile apparatus 1 receives the notification sent from the server 2.

Subsequently, in Step S122, the drive control section 151 executes at least one of the activation of an unused function and the enhancement of a used function in accordance with the notification received by the communication part 19.

In this Embodiment 1, when the remaining lifetime of the body is shorter than the remaining lifetime of the battery, at least one of an activation of an unused function and an enhancement of a used function among a plurality of functions consuming the electric power of the mobile apparatus 1 is instructed. Therefore, the remaining lifetime of the storage battery 14 of the mobile apparatus 1 can be made to approach the remaining lifetime of the body of the mobile apparatus 1. This can consequently prevent a disposal of the storage battery 14 still having a lifetime together with the body having no lifetime. Further, the activation of an unused function or the enhancement of a used function can increase the convenience for the driver. In other words, the remaining lifetime of the storage battery 14 of a mobile apparatus 1 can be made to approach the remaining lifetime of the body of the mobile apparatus 1 by efficiently consuming the lifetime of the storage battery 14 of the mobile apparatus 1.

In this Embodiment 1, the server 2 sends to the mobile apparatus 1 a notification instructing the determined at least one of the activation of the function and the enhancement of the function, but the present disclosure is not particularly limited thereto. The information terminal 3 may send to the mobile apparatus 1 a notification instructing the determined at least one of the activation of the function and the enhancement of the function.

Embodiment 2

In Embodiment 1 above, the function presenting portion 251 causes the information terminal 3 to present at least one of an activation of an unused function and an enhancement of a used function. On the other hand, in Embodiment 2, at least one of an activation of an unused function and an enhancement of a used function is not presented on the information terminal 3, at least one of an activation of an unused function and an enhancement of a used function is determined, and a notification instructing the determined at least one of the function to be activated and the function to be enhanced is sent to the mobile apparatus 1.

Figure 13:
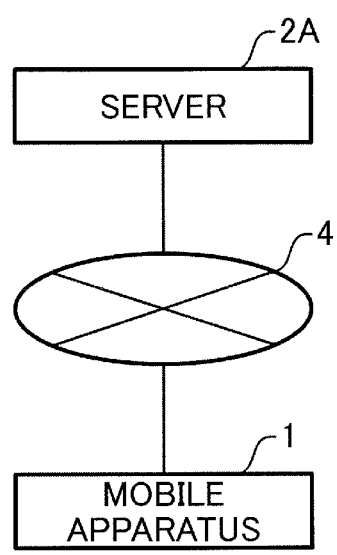
FIG. 13 is a diagram showing a general configuration of an information processing system according to Embodiment 2 of the present disclosure.

FIG. 13 is a diagram showing a general configuration of an information processing system according to Embodiment 2 of the present disclosure.

An information processing system shown in FIG. 13 includes a mobile apparatus 1 and a server 2A. The information processing system in Embodiment 2 is not provided with an information terminal 3. In this Embodiment 2, the same constituent elements as those of Embodiment 1 will be allotted with the same reference numerals, and the description thereof will be omitted.

The server 2A is, for example, a web server. The server 2A receives various information from the mobile apparatus 1, and sends various information to the mobile apparatus 1. The server 2A calculates a remaining lifetime of the body of the mobile apparatus 1, and calculates a remaining lifetime of the battery. Thereafter, the server 2A compares the remaining lifetime of the body with the remaining lifetime of the battery, and instructs, when the remaining lifetime of the body is shorter than the remaining lifetime of the battery, at least one of an activation of an unused function and an enhancement of a used function among a plurality of functions consuming the electric power of the mobile apparatus 1. The server 2A is mutually communicably connected to the mobile apparatus 1 via the network 4.

Figure 14:
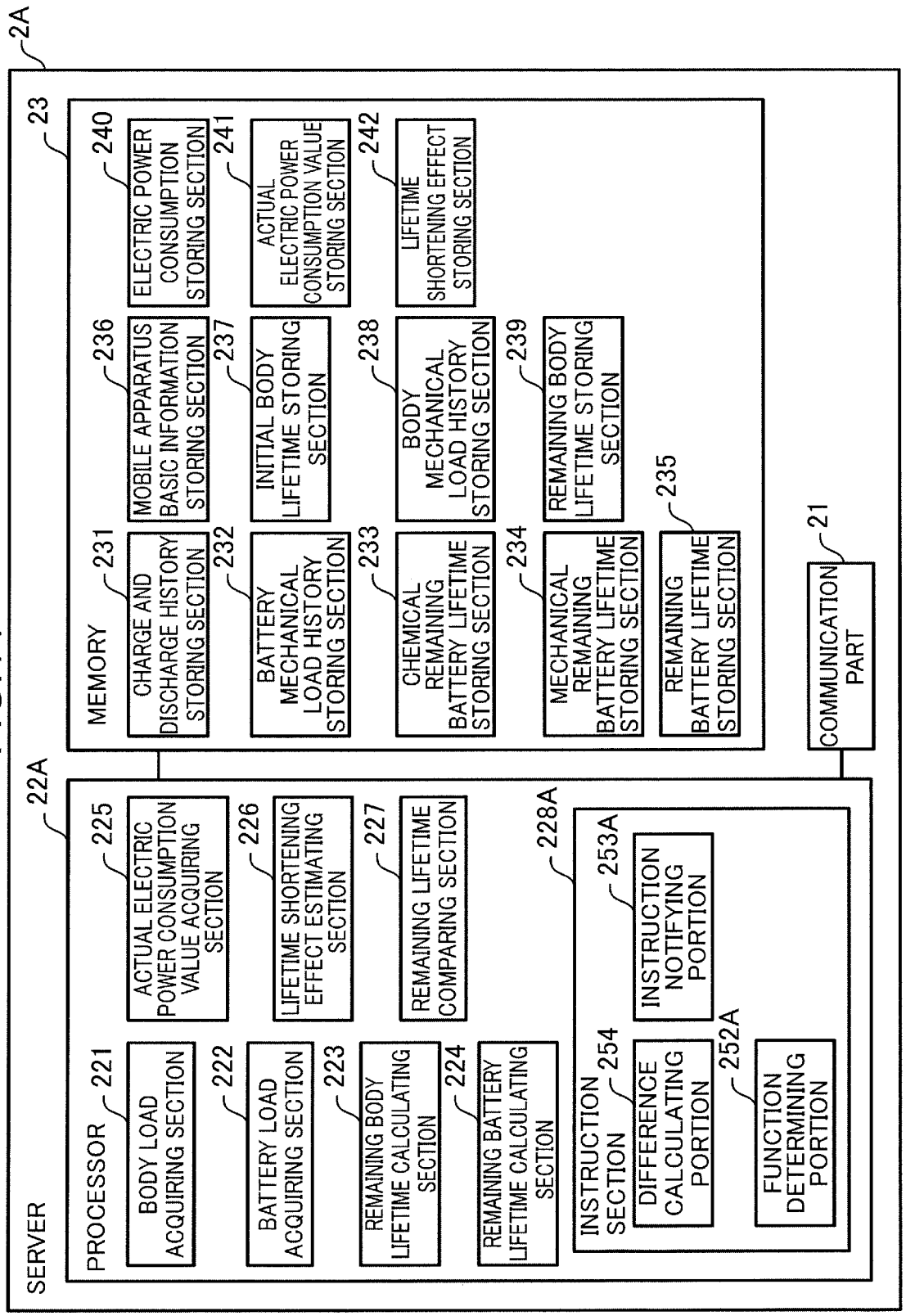
FIG. 14 is a diagram showing an exemplary configuration of a server according to Embodiment 2 of the present disclosure.

FIG. 14 is a diagram showing an exemplary configuration of a server according to Embodiment 2 of the present disclosure.

The server 2A shown in FIG. 14 includes a communication part 21, a processor 22A, and a memory 23.

The processor 22A is, for example, a CPU. The processor 22A furnishes a body load acquiring section 221, a battery load acquiring section 222, a remaining body lifetime calculating section 223, a remaining battery lifetime calculating section 224, an actual electric power consumption value acquiring section 225, a lifetime shortening effect estimating section 226, a remaining lifetime comparing section 227, and an instruction section 228A.

When the remaining lifetime of the body is shorter than the remaining lifetime of the storage battery (battery) 14, the instruction section 228A instructs at least one of an activation of an unused function and an enhancement of a used function among a plurality of functions consuming the electric power of the mobile apparatus 1.

The instruction section 228A has a difference calculating portion 254, a function determining portion 252A, and an instruction notifying portion 253A.

The difference calculating portion 254 calculates a difference between the remaining lifetime of the storage battery (battery) 14 and the remaining lifetime of the body.

The function determining portion 252A determines at least one of the function to be activated and the function to be enhanced on the basis of the difference calculated by the difference calculating portion 254. The function determining portion 252A calculates a reduction of the remaining lifetime of the storage battery 14 due to the activation of an unused function on the basis of an electric power consumption in the case of activating the unused function. Further, the function determining portion 252A calculates a reduction of the remaining lifetime of the storage battery 14 due to the enhancement of a used function on the basis of an electric power consumption in the case of enhancing the used function. The function determining portion 252A determines at least one of a function to be activated and a function to be enhanced in such a manner that at least one of a reduction of the remaining lifetime of the storage battery 14 due to the activation of an unused function and a reduction of the remaining lifetime of the storage battery 14 due to the enhancement of a used function is kept from exceeding a difference between the remaining lifetime of the storage battery 14 and the remaining lifetime of the body.

The instruction notifying portion 253A instructs the at least one of the activation of the function and the enhancement of the function which is determined by the function determining portion 252A.

Since the process of calculating the remaining battery lifetime, the process of calculating the remaining body lifetime, and the process of estimating respective lifetime shortening effects of the functions in Embodiment 2 of the present disclosure are the same as those in Embodiment 1, the description thereof will be omitted.

Hereinafter, the process of comparing a remaining body lifetime with a remaining battery lifetime in Embodiment 2 of the present disclosure will be described.

FIG. 15 is a flowchart showing a process of comparing a remaining body lifetime with a remaining battery lifetime in Embodiment 2 of the present disclosure.

Since the processings from Steps S131 to S134 are the same as the processings from Steps S91 to S94 shown in FIG. 8, the description thereof will be omitted.

When it is judged that the remaining body lifetime is shorter than the remaining battery lifetime (YES in Step S134), in Step S135, the difference calculating portion 254 calculates a difference between the remaining body lifetime and the remaining battery lifetime.

Thereafter, in Step S136, the function determining portion 252A acquires the lifetime shortening effect of each function from the lifetime shortening effect storing section 242.

Subsequently, in Step S137, the function determining portion 252A acquires the mobile apparatus basic information from the mobile apparatus basic information storing section 236. The mobile apparatus basic information includes a type of the mobile apparatus 1, a use mode of the mobile apparatus 1, and a use record of the mobile apparatus 1.

Thereafter, in Step S138, the function determining portion 252A determines at least one of a function to be activated and a function to be enhanced on the basis of the lifetime shortening effect, the mobile apparatus basic information, and the difference between the remaining body lifetime and the remaining battery lifetime.

Here, the function determining portion 252A selects, among the functions, a function appropriate for the type of the mobile apparatus included in the mobile apparatus basic information. Thereafter, the function determining portion 252A selects, among the selected functions, a function appropriate for a use mode. Specifically, in a certain use mode, the use of a function is permitted, whereas the use of another function is not permitted. Accordingly, the function determining portion 252A further selects, among the selected functions, a function appropriate for the use mode. Thereafter, the function determining portion 252A determines, among the selected functions, a function having a lifetime shortening effect shorter than a difference between the remaining body lifetime and the remaining battery lifetime as the at least one of a function to be activated and a function to be enhanced. When there is a plurality of functions having respective lifetime shortening effects shorter than the difference between the remaining body lifetime and the remaining battery lifetime, the function determining portion 252A may determine a function having the greatest lifetime shortening effect.

Further, the function determining portion 252A may determine a priority degree of at least one of a function to be activated and a function to be enhanced in accordance with at least one of the type, use mode, and use record of the mobile apparatus 1 included in the mobile apparatus basic information. When there is a plurality of functions having respective lifetime shortening effects shorter than the difference between the remaining body lifetime and the remaining battery lifetime, the function determining portion 252A may determine a function having the highest priority degree among the functions as the function to be activated or the function to be enhanced.

Thereafter, in Step S139, the instruction notifying portion 253A sends to the mobile apparatus 1 via the communication part 21 a notification instructing the at least one of the activation of the function and the enhancement of the function which is determined by the function determining portion 252A.

Subsequently, in Step S141, the communication part 19 of the mobile apparatus 1 receives the notification sent from the server 2A.

Subsequently, in Step S142, the drive control section 151 executes at least one of the activation of the unused function and the enhancement of the used function in accordance with the notification received by the communication part 19.

In this Embodiment 2, at least one of the function to be activated and the function to be enhanced is automatically instructed, thereby allowing the mobile apparatus 1 to automatically execute the instructed at least one of the activation of the function and the enhancement of the function.

Note that, in the above embodiments, each constituent element may be configured with dedicated hardware or may be obtained by executing a software program suitable for each constituent element. Each constituent element may be obtained by a program execution part, such as a CPU or a processor, reading and executing a software program recorded in recording medium, such as a hard disk or a semiconductor memory. Further, a program may be executed by another independent computer system by recording the program on storage medium and transferring the program, or by transferring the program via a network.

Part or all of the functions of the device according to the embodiments of the present disclosure are established in a large scale integration (LSI), which is typically an integrated circuit. These may be established in chips individually, or may be established in a single chip including part or all of these. Further, the circuit integration is not limited to LSI, and may be achieved by a dedicated circuit or a general-purpose processor. A field programmable gate array (FPGA) that can be programmed after LSI fabrication, or a reconfigurable processor that can reconfigure connection and setting of circuit cells inside LSI may be used.

Further, part or all of the functions of the device according to the embodiments of the present disclosure may be established by a processor, such as a CPU, executing a program.

Further, all the numerals used above are illustrated to specifically describe the present disclosure, and the present disclosure is not limited to the illustrated numerals.

Further, the order in which the steps shown in the flowchart are performed is illustrated to specifically describe the present disclosure, and may be the order other than the above as long as similar effects can be obtained. Further, part of the above steps may be performed simultaneously (in parallel) with other steps.

INDUSTRIAL APPLICABILITY

The technology according to the present disclosure enables a remaining lifetime of a battery of a mobile apparatus to approach a remaining lifetime of a body of the mobile apparatus, and thus is useful in a technology for managing a remaining lifetime of a body of an electric mobile apparatus and a remaining lifetime of a battery mounted on the mobile apparatus.

The invention claimed is:

1. An information processing method, by a computer, comprising:
acquiring first data concerning a load applied to a body of an electric mobile apparatus having an electric motor mounted on the electric mobile apparatus and a battery mounted on the electric mobile apparatus powering a battery-powered device;
acquiring second data concerning the performance of the battery mounted on the electric mobile apparatus;
calculating a remaining lifetime of the body on the basis of the first data;
calculating a remaining lifetime of the battery on the basis of the second data;
comparing the remaining lifetime of the body with the remaining lifetime of the battery;
instructing movement of the electric mobile apparatus by controlling the electric motor and instructing activation of the battery-powered device in a first instructing operation; and
instructing, in a second instructing operation, at least one of
i) an activation of an unused function of the battery-powered device and
ii) an enhancement of a used function of the battery-powered device or the electric motor among a plurality of functions consuming the electric power of the battery of the electric mobile apparatus,
when the remaining lifetime of the body is shorter than the remaining lifetime of the battery,
wherein the second instructing operation includes
displaying on a display, selectable functions including at least one of the unused function and the enhancement of the used function,
receiving an input from a user of an instruction to activate one of the displayed selectable functions, and activating the displayed selectable function input by the user, and wherein the displaying of the selectable functions includes acquiring information that identifies the electric mobile apparatus as an electric kick scooter, an electric bicycle, or an electric car, acquiring information that identifies a use mode of the electric mobile apparatus, acquiring information on a record of use of the electric mobile apparatus, determining at least one candidate to be displayed as one of the selectable functions in accordance with the acquired information that identifies the electric mobile apparatus as an electric kick scooter, an electric bicycle, or an electric car, the acquired information on the use mode of the electric mobile apparatus, and the acquired information on the record of use of the electric mobile apparatus, and displaying the determined at least one candidate.

2. The information processing method according to claim 1, further comprising:

calculating a difference between the remaining lifetime of the battery and the remaining lifetime of the body;

determining at least one candidate of the unused function and the enhancement of the used function in accordance with the calculated difference; and displaying on the display the determined candidate.

3. The information processing method according to claim 1, further comprising:

determining a priority degree of the display of at least one of the unused function and the enhancement of the used function in accordance with the acquired i) information that identifies the electric mobile apparatus as an electric kick scooter, an electric bicycle, or an electric car, ii) information that identifies a use mode of the electric mobile apparatus, and iii) information on a record of use of the electric mobile apparatus, and displaying at least one of the activation of the unused function and the enhancement of the used function on the display according to the determined priority degree.

4. The information processing method according to claim 1, wherein in the second instructing operation, a difference between the remaining lifetime of the battery and the remaining lifetime of the body is calculated, at least one of the unused function and the enhancement of the used function is determined in accordance with the difference, and the determined at least one of the unused function and the enhancement of the used function is instructed.

5. The information processing method according to claim 1, wherein the remaining lifetime of the body and the remaining lifetime of the battery are expressed in the form of a remaining travel distance which the electric mobile apparatus can travel up to.

6. The information processing method according to claim 1, wherein the functions include a function of controlling the travel of the electric mobile apparatus.

7. The information processing method according to claim 1, wherein the functions include a function of assisting a visual perception of the electric mobile apparatus.

8. The information processing method according to claim 1, wherein the functions include a function of controlling a space of the electric mobile apparatus.

9. The information processing method according to claim 1, wherein the functions include a function of supplying an electric power to an outside of the electric mobile apparatus.

10. The information processing method according to claim 1, wherein the functions include a function of performing communications of the electric mobile apparatus, or a function of performing an external connection by use of the communication function.

11. The information processing method according to claim 1, wherein the first data includes at least one of a travelled distance of the electric mobile apparatus and the number of times the electric mobile apparatus shakes, and the processor calculates the remaining lifetime of the body on the basis of a statistical lifetime of the electric mobile apparatus, and the at least one of the travelled distance of the electric mobile apparatus and the number of times of the electric mobile apparatus shakes.

12. The information processing method according to claim 1, wherein the second data includes a history of at least one of a charge, a discharge, a charge capacity, and a temperature of the battery, and in the calculation of a remaining lifetime of the battery, the remaining lifetime of the battery is calculated on the basis of a lifetime of the battery and a deterioration level of the battery calculated from the history of the battery.

13. An information processing system, comprising:

a processor configured to acquire first data concerning a load applied to a body of an electric mobile apparatus having an electric motor mounted on the electric mobile apparatus and a battery mounted on the electric mobile apparatus powering a battery-powered device;

acquire second data concerning the performance of a battery mounted on the electric mobile apparatus;

calculate a remaining lifetime of the body on the basis of the first data;

calculate a remaining lifetime of the battery on the basis of the second data;

compare the remaining lifetime of the body with the remaining lifetime of the battery;

instruct movement of the electric mobile apparatus by controlling the electric motor and instructing activation of the battery-powered device in a first instructing operation; and instruct in a second instructing operation, at least one of i) an activation of an unused function of the battery-powered device, and ii) an enhancement of a used function of the battery-powered device or the electric motor among a plurality of functions consuming the electric power of the battery of the electric mobile apparatus, when the remaining lifetime of the body is shorter than the remaining lifetime of the battery, wherein the second instructing operation includes displaying on a display, selectable functions including at least one of the unused function and the enhancement of the used function, receiving an input from a user of an instruction to activate one of the displayed selectable functions, and activating the displayed selectable function input by the user, and wherein the displaying of the selectable functions includes
- acquiring information that identifies the electric mobile apparatus as an electric kick scooter, an electric bicycle, or an electric car,
- acquiring information that identifies a use mode of the electric mobile apparatus,
- acquiring information on a record of use of the electric mobile apparatus,
- determining at least one candidate to be displayed as one of the selectable functions in accordance with
  - the acquired information that identifies the electric mobile apparatus as an electric kick scooter, an electric bicycle, or an electric car,
  - the acquired information on the use mode of the electric mobile apparatus, and
  - the acquired information on the record of use of the electric mobile apparatus, and
- displaying the determined candidate.

* * * * *